(12) United States Patent
Nishida et al.

(10) Patent No.: US 11,037,848 B2
(45) Date of Patent: Jun. 15, 2021

(54) SEMICONDUCTOR MODULE AND SEMICONDUCTOR MODULE MANUFACTURING METHOD

(71) Applicant: FUJI ELECTRIC CO., LTD., Kawasaki (JP)

(72) Inventors: Yuhei Nishida, Matsumoto (JP); Tatsuo Nishizawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/203,160

(22) Filed: Nov. 28, 2018

(65) Prior Publication Data

US 2019/0189529 A1 Jun. 20, 2019

(30) Foreign Application Priority Data

Dec. 19, 2017 (JP) .............................. JP2017-242389
Aug. 2, 2018 (JP) .............................. JP2018-146010

(51) Int. Cl.
| | |
|---|---|
| *H01L 23/31* | (2006.01) |
| *H01L 23/08* | (2006.01) |
| *H05K 1/11* | (2006.01) |
| *H05K 1/05* | (2006.01) |
| *H01L 23/532* | (2006.01) |
| *H01L 21/56* | (2006.01) |

(Continued)

(52) U.S. Cl.
CPC ........ *H01L 23/3142* (2013.01); *H01L 21/565* (2013.01); *H01L 23/08* (2013.01); *H01L 23/3735* (2013.01); *H01L 23/5329* (2013.01); *H01L 24/00* (2013.01); *H05K 1/05* (2013.01); *H05K 1/119* (2013.01); *H01L 23/3121* (2013.01)

(58) Field of Classification Search
CPC ... H01L 21/4885–4986; H01L 21/4846–4867; H01L 23/498–59866; H01L 23/055–057
See application file for complete search history.

(56) References Cited

U.S. PATENT DOCUMENTS

| | | | |
|---|---|---|---|
| 8,610,261 | B2 | 12/2013 | Oka et al. |
| 9,406,603 | B2 | 8/2016 | Nishizawa et al. |
| 9,786,587 | B2 | 10/2017 | Nishizawa et al. |

(Continued)

FOREIGN PATENT DOCUMENTS

| | | | |
|---|---|---|---|
| JP | 200727467 | A | 2/2007 |
| JP | 2010129797 | A | 6/2010 |

(Continued)

*Primary Examiner* — Cuong B Nguyen

(57) ABSTRACT

A semiconductor module includes block-shaped first and second lower base members provided by bonding of flat lower surfaces on an insulated circuit board and having bottomed first and second hole portions open in upper surfaces in upper portions of the first and second lower base members, tubular first and second upper slide support members inserted in the first and second hole portions in a state where at least a part of outside surfaces is in contact with inside walls of the first and second hole portions, first and second pins inserted in contact with the insides of the first and second upper slide support members, and a sealing resin sealing the first and second pins except for the upper portions of the first and second pins.

20 Claims, 14 Drawing Sheets

(51) Int. Cl.
*H01L 23/373* (2006.01)
*H01L 23/00* (2006.01)

(56) References Cited

U.S. PATENT DOCUMENTS

| | | | |
|---|---|---|---|
| 2009/0146272 A1* | 6/2009 | Wieneke Kessler | ........................ H01L 23/3107 257/666 |
| 2010/0127389 A1* | 5/2010 | Obiraki | ................. H01L 23/142 257/712 |
| 2010/0133681 A1 | 6/2010 | Oka et al. | |
| 2014/0246783 A1 | 9/2014 | Nishizawa et al. | |
| 2016/0322287 A1 | 11/2016 | Nishizawa et al. | |

FOREIGN PATENT DOCUMENTS

| | | |
|---|---|---|
| JP | 2010182879 A | 8/2010 |
| JP | 2010283107 A | 12/2010 |
| JP | 201330792 A | 2/2013 |
| JP | 201362407 A | 4/2013 |
| JP | 2013-125803 A | 6/2013 |
| JP | 2013-125804 A | 6/2013 |
| JP | 201449582 A | 3/2014 |
| JP | 2016-154258 A | 8/2016 |

\* cited by examiner

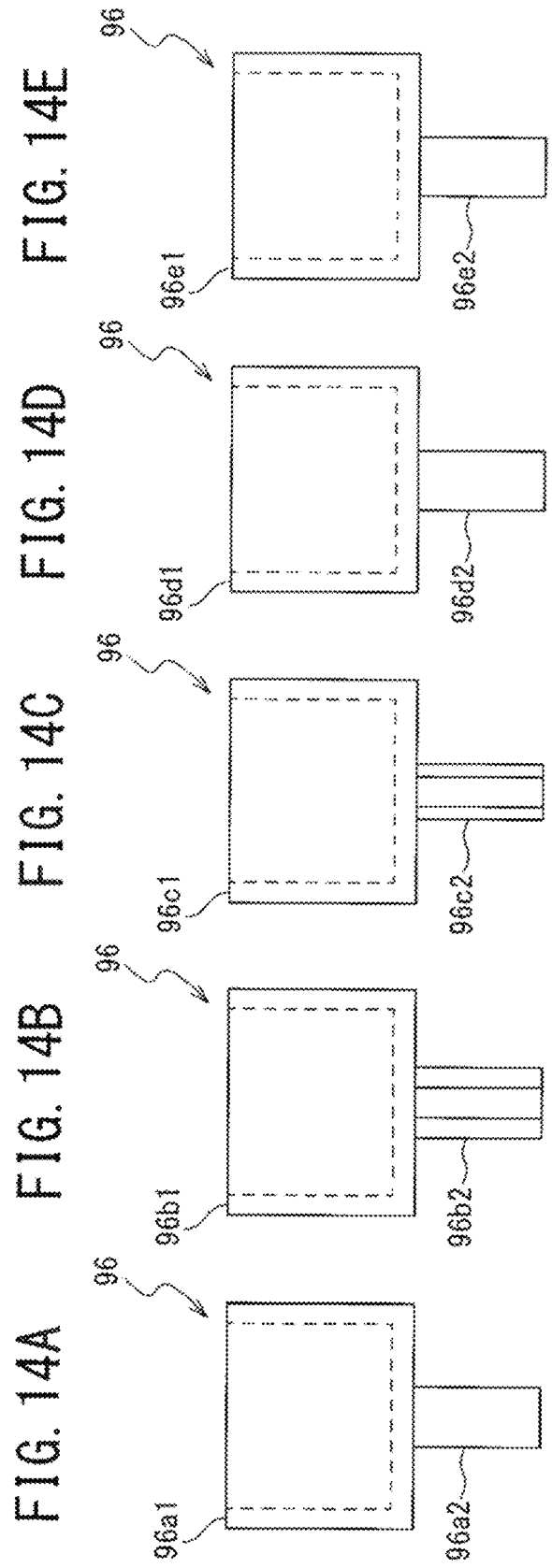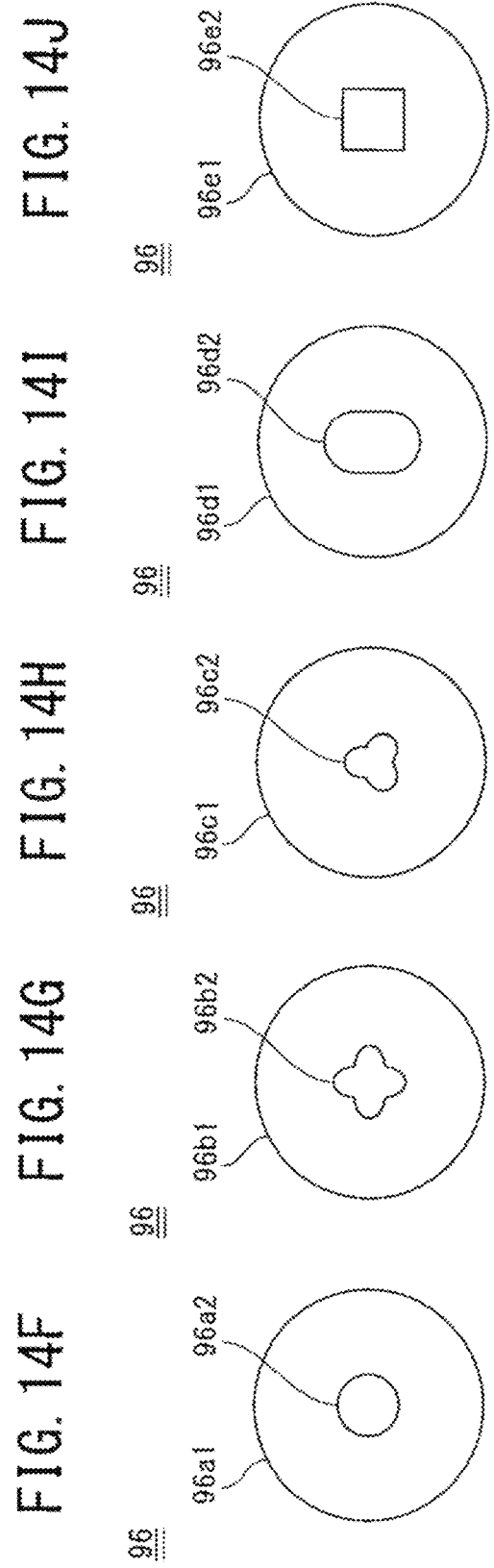

SEMICONDUCTOR MODULE AND
SEMICONDUCTOR MODULE
MANUFACTURING METHOD

CROSS-REFERENCE TO RELATED
APPLICATION

This application claims the benefit of foreign priority to Japanese Patent Applications No. JP2017-242389, filed Dec. 19, 2017, and No. JP2018-146010, filed Aug. 2, 2018, which are incorporated by reference in their entirety.

BACKGROUND OF THE INVENTION

1. Field of the Invention

The present invention relates to a semiconductor module and a semiconductor module manufacturing method.

2. Description of the Related Art

In a semiconductor device, a power semiconductor device in particular, an entirely resin-sealed semiconductor module in which a semiconductor element is mounted and an external device such as a general-purpose inverter are connected via an external connection terminal extending and protruding on a sealing resin. In a case where a pin-shaped member is used as the external connection terminal, a large number of pins are continuously cut out from, for example, one long copper wire so as to have a set and constant prescribed length. During the cutting processing, a slight difference of, for example, approximately 100 µm to 200 µm may occur between the lengths of the pins due to jig position misalignment and the like.

Even if the difference between the pin lengths is, for example, small, in a case where a large current flows with precision as in the power semiconductor device, a bonding failure may occur between the pin and a connecting conductor such as a bus bar bonded to the pin, and then the quality of the semiconductor device may deteriorate. Accordingly, it is important to accurately align the lengths of the pins extending from the semiconductor module in accordance with a design specification value.

JP 2007-027467 A (PTL 1) discloses an example of a semiconductor device provided with a pin-shaped external connection terminal. The semiconductor module that is disclosed in PTL 1 is provided with a substrate, a heat spreader provided on the substrate and having a hole portion, and a pin-shaped external terminal having a lower portion inserted in the hole portion and locked to the heat spreader. JP 2010-129797 A (PTL 2) discloses a structure in which a tubular conductor is provided on a wiring pattern of a metallic circuit board and a pin-shaped external terminal is inserted inside the tubular conductor.

JP 2013-030792 A (PTL 3) discloses an example of a tubular (sleeve-shaped) member into which a pin-shaped external connection terminal is inserted. Integrated in the integrated resin-based sleeve structure that is disclosed in PTL 3 are a plurality of metallic socket electrode terminals disposed on a circuit pattern of an insulating substrate and a plurality of sleeve portions respectively fitted from above into the metallic socket electrode terminals with both ends open. JP 2013-062407 A (PTL 4) discloses a semiconductor device including a terminal member attached on a circuit pattern portion and a mold resin in which the circuit pattern portion, a semiconductor chip, and the terminal member are sealed. A nut and the like constitute the tubular terminal member. The terminal member has an upper end surface exposed to the outer surface of the mold resin. The terminal member has a screw hole open in the upper end surface. JP 2014-049582 A (PTL 5) discloses a semiconductor device including a cylinder socket having one end bonded to a circuit pattern, a sealing body sealing the circuit pattern, a plurality of the cylinder sockets, and a semiconductor element, and an external electrode connection terminal inserted from the inside into the sealing body. A plurality of insertion portions protruding downwards are provided in the lower portion of the body portion of the external electrode connection terminal, and the insertion portion is inserted inside the cylinder socket.

JP 2010-182879 A (PTL 6) discloses a semiconductor module. In this module, a plurality of resin housing recessed portions are provided in the upper portion of a resin housing such that the bottom surfaces of the resin housing recessed portions are lower than other portions, and a rod-shaped electrode of a terminal is disposed so as to extend upwards in the resin housing recessed portion. According to PTL 6, a bottomed cylindrical columnar electrode is first bonded by soldering and the like onto a circuit pattern of an insulated circuit board, and then the inner portion of the resin housing is sealed with resin by integral molding in which the insulated circuit board is used as an insert structure. After the resin sealing, the rod-shaped electrode is inserted and fixed from the opening portion of the tube of the columnar electrode open to the outside. A columnar electrode misalignment attributable to the dimensional accuracy of the insert structure, a jig, a solder resist, and the like can be inspected with ease simply by the relative positions of the resin housing recessed portion and the terminal being measured and compared.

JP 2010-283107 A (PTL 7) discloses a semiconductor module including a cylindrical member as a bottomed electrode having a bottom surface provided with a projecting portion. In this module, the upper portion of a pin is positioned outside the cylindrical member by the pin being inserted inside the cylindrical member. The upper portion of the pin positioned on the upper surface side becomes a part taken out as a semiconductor module terminal. The cylindrical member and a lower circuit board are bonded by soldering. As a result, a solder layer is formed such that the projecting portion of the cylindrical member is interposed inside. According to PTL 7, the thickness of the solder layer is controlled for terminal fixing on a substrate or an element.

None of PTLs 1 to 7 examines mismatching in the length of the pin protruding on the sealing resin and a technique for eliminating the mismatch by means of length adjustment. In this regard, misalignment of the tubular columnar electrode can be inspected according to PTL 6. However, this inspection is to confirm a position viewed in a planar pattern, and is not specific means for correcting the length and misalignment of a protruding pin.

In a case where outsert molding is adopted as in PTLs 6 and 7 so that a pin is inserted from the outside into an insulated circuit board after the insulated circuit board is sealed with, for example, resin or gel, a sealing process is completed before the pin insertion, and thus the disposition of a sealed internal member can hardly be corrected. Accordingly, the outsert molding may lead to a relatively large amount of products with a lower accuracy in terms of pin length and position.

SUMMARY OF THE INVENTION

The invention has been made in view of the above problems, and an object of the invention is to provide a semiconductor module and a method for manufacturing the semiconductor module in which a pin protruding on a sealing resin has a protruding length controlled to a desired value.

In order to solve the above problem, an aspect of a semiconductor module according to the invention includes an insulated circuit board, a block-shaped lower base member having a flat lower surface, provided by the lower surface being bonded onto the insulated circuit board, and having a bottomed hole portion open in an upper surface in an upper portion of the lower base member, a tubular upper slide support member inserted in the hole portion in a state where at least a part of an outside surface of the upper slide support member is in contact with an inside wall of the hole portion, a pin inserted in contact with an inside of the tube of the upper slide support member, and a sealing resin sealing the pin in the sealing resin except for an upper portion of the pin on a side opposite to the upper slide support member and sealing the insulated circuit board, the lower base member, and the upper slide support member.

An aspect of a semiconductor module manufacturing method according to the invention includes a first process in which a block-shaped lower base member is bonded onto an insulated circuit board via a flat lower surface of the lower base member having a bottomed hole portion open in an upper surface in an upper portion of the lower base member, a second process in which a tubular upper slide support member is inserted into the hole portion in a state where an outside surface of the upper slide support member is in contact with an inside wall of the hole portion, a third process in which a pin is slidably fitted inside the tube of the upper slide support member in a state where a gap is formed between a lower end of the pin and a bottom of the hole portion, a fourth process in which the pin is slid inside the upper slide support member and adjusted to a preset insertion depth by an upper end of the pin on a side opposite to the upper slide support member being pushed to the upper slide support member side such that the lower end of the pin moves toward the bottom of the hole portion inside the gap, and a fifth process in which the pin is sealed except for an upper portion of the pin on a side opposite to the upper slide support member and the insulated circuit board, the lower base member, and the upper slide support member are sealed with a sealing resin.

BRIEF DESCRIPTION OF THE DRAWINGS

FIG. 14A is a front view schematically illustrating the outlines of the configuration of the lower portion of a first upper slide support member used in a semiconductor module according to a ninth modification example of the embodiment of the invention;

FIG. 14B is a front view schematically illustrating the outlines of the configuration of the lower portion of a first upper slide support member used in a semiconductor module according to a ninth modification example of the embodiment of the invention;

FIG. 14C is a front view schematically illustrating the outlines of the configuration of the lower portion of a first upper slide support member used in a semiconductor module according to a ninth modification example of the embodiment of the invention;

FIG. 14D is a front view schematically illustrating the outlines of the configuration of the lower portion of a first upper slide support member used in a semiconductor module according to a ninth modification example of the embodiment of the invention;

FIG. 14E is a front view schematically illustrating the outlines of the configuration of the lower portion of a first upper slide support member used in a semiconductor module according to a ninth modification example of the embodiment of the invention;

FIG. 14F is a bottom view in which the lower portions of the first upper slide support member respectively illustrated in FIG. 14A is seen from below;

FIG. 14G is a bottom view in which the lower portions of the first upper slide support member respectively illustrated in FIG. 14B is seen from below;

FIG. 14H is a bottom view in which the lower portions of the first upper slide support member respectively illustrated in FIG. 14C is seen from below;

FIG. 14I is a bottom view in which the lower portions of the first upper slide support member respectively illustrated in FIG. 14D is seen from below; and FIG. 14J is a bottom view in which the lower portions of the first upper slide support member respectively illustrated in FIG. 14E is seen from below.

DETAILED DESCRIPTION

Figure 1:
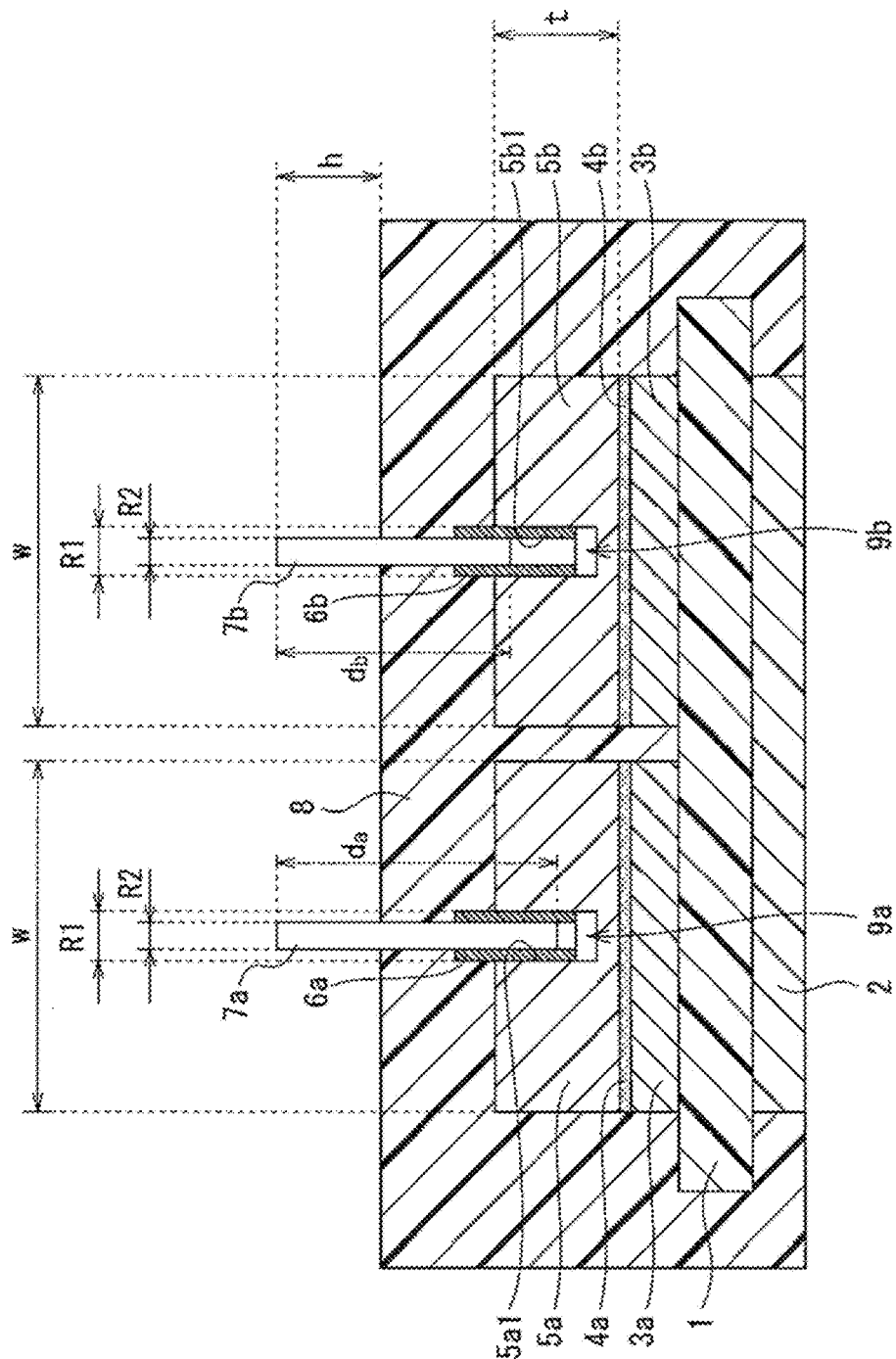
FIG. 1 is a cross-sectional view schematically illustrating the outline of the configuration of a semiconductor module according to an embodiment of the invention.

An embodiment of the invention will be described below. In the following description of accompanying drawings, the same or similar reference numerals are attached to the same or similar parts. However, it should be noted that the drawings are schematic and thickness-planar dimension relationships, the ratios of the thicknesses of devices and members, and the like are different from the actual ones. Therefore, specific thicknesses and dimensions should be determined with reference to the following description. In addition, it is a matter of course that the drawings include parts with different mutual dimensional relationships and ratios. Further, the "right-left" and "upper-lower" directions in the following description are merely for convenience of description and do not limit the technical idea of the invention. Therefore, it is a matter of course that the "right-left" and the "upper-lower" are exchanged in reading when, for example, the page is rotated by 90 degrees and the "left" becomes the "right" and vice versa when the page is rotated by 180 degrees.

—Structure of Semiconductor Module—

A semiconductor module according to the embodiment of the invention has, for example, a rectangular parallelepiped shape as a whole with an insulated circuit board (1, 2, 3a, 3b) sealed inside a sealing resin 8 as illustrated in FIG. 1. The insulated circuit board (1, 2, 3a, 3b) has an insulating plate 1 made of a ceramic substrate and the like, a first surface conductive layer 3a and a second surface conductive layer 3b provided on the upper surface side of the insulating plate 1, and a back surface conductive layer 2 provided on the lower surface side of the insulating plate 1. The first surface conductive layer 3a, the second surface conductive layer 3b, and the back surface conductive layer 2 can be made of, for example, a copper plate and the like.

A circuit pattern is formed on the first surface conductive layer 3a and the second surface conductive layer 3b, and a power semiconductor chip such as a metal-oxide-semiconductor (MOSFET) and a diode is mounted on the circuit pattern. For convenience of description, the power semiconductor chip is not illustrated in FIG. 1.

The lower surface of the back surface conductive layer 2 is exposed to the outside on the lower side of the sealing resin 8 and forms the lower surface of the semiconductor module. A bonding layer 4a such as solder is provided on the upper surface of the first surface conductive layer 3a, and a block-shaped first lower base member 5a is provided on the bonding layer 4a by bonding of a flat lower surface. Likewise, a bonding layer 4b is provided on the upper surface of the second surface conductive layer 3b, and a block-shaped second lower base member 5b is provided on the bonding layer 4b by bonding of a flat lower surface.

Each of the first lower base member 5a and the second lower base member 5b can be made of copper and the like and has a constant width w in the right-left direction in FIG. 1 and a constant thickness t in the upper-lower direction in FIG. 1. As the shapes of the first lower base member 5a and the second lower base member 5b having flat lower surfaces, a simple shape such as a circular pillar shape and a quadrangular prism shape can be adopted in the interest of manufacturing convenience. Also adoptable is a shape such as a hexagonal prism shape and another polygonal prism shape.

The first lower base member 5a has a bottomed first hole portion 5a1 open in the upper surface of the first lower base member 5a at substantially the center in the right-left direction in FIG. 1 in the upper portion of the first lower base member 5a, and the second lower base member 5b has a bottomed second hole portion 5b1 open in the upper surface of the second lower base member 5b at substantially the center in the right-left direction in FIG. 1 in the upper portion of the second lower base member 5b. The bottom surfaces of the first hole portion 5a1 and the second hole portion 5b1 are circular, and the internal spaces of the first hole portion 5a1 and the second hole portion 5b1 have a circular pillar shape. It should be noted that the positions of the first hole portion 5a1 and the second hole portion 5b1 are not limited to the centers of the upper portions of the lower base members and can be appropriately changed to any positions.

A cylindrical first upper slide support member 6a is inserted inside the first hole portion 5a1 in a state where the outside surface of the first upper slide support member 6a is in contact with the inside wall of the first hole portion 5a1. Likewise, a cylindrical second upper slide support member 6b is inserted inside the second hole portion 5b1 in a state where the outside surface of the second upper slide support member 6b is in contact with the inside wall of the second hole portion 5b1. The first upper slide support member 6a and the second upper slide support member 6b have almost the same diameter (outer diameter) R1.

From empirical rules, it is preferable that the thickness t of the first lower base member 5a is 300 μm or more and 1 mm or less. If the thickness t is less than 300 μm, the first upper slide support member 6a is unlikely to be stably supported by the first lower base member 5a. If the thickness exceeds the upper limit value of 1 mm, the first lower base member 5a becomes excessively thick, causing an increase in manufacturing cost. Preferably, the width w of the first lower base member 5a measured along the diameter R1 of the first upper slide support member 6a is at least three times the diameter R1 of the first upper slide support member 6a from the viewpoint of stable support of the first upper slide support member 6a. The thickness t and the width w of the second lower base member 5b are set similarly to the case of the first upper slide support member 6a.

The first upper slide support member 6a on the left side in FIG. 1 is fitted inside the first hole portion 5a1 in a state where the upper end of the first upper slide support member 6a protrudes upwards by a certain height from the upper surface of the first hole portion 5a1, and a gap 9a is formed between the bottom surface of the first hole portion 5a1 and the lower end of the first upper slide support member 6a. The second upper slide support member 6b on the right side in FIG. 1 is fitted inside the second hole portion 5b1 in a state where the upper end of the second upper slide support member 6b protrudes upwards by a certain height from the upper surface of the second hole portion 5b1, and a gap 9b is formed between the bottom surface of the second hole portion 5b1 and the lower end of the second upper slide support member 6b.

A circular pillar-shaped first pin 7a, which is an external connection terminal, is inserted inside the tube of the first upper slide support member 6a in a state where the outside surface of the first pin 7a is in contact with the inside surface of the tube of the first upper slide support member 6a. The lower end of the first pin 7a is positioned above the lower end of the first upper slide support member 6a on the gap 9a of the first hole portion 5a1. Likewise, a circular pillar-shaped second pin 7b, which is an external connection terminal, is inserted inside the tube of the second upper slide support member 6b in a state where the outside surface of the second pin 7b is in contact with the inside surface of the tube of the second upper slide support member 6b. The lower end of the second pin 7b is positioned above the lower end of the second upper slide support member 6b on the gap 9b of the second hole portion 5b1.

The first pin 7a and the second pin 7b have almost the same diameter (outer diameter) R2, and the upper portion of the first pin 7a on the side opposite to the first upper slide support member 6a protrudes by a constant protruding height h from the upper surface of the sealing resin 8 and extends vertically upwards. Likewise, the upper portion of the second pin 7b protrudes by the same protruding height h as in the case of the first pin 7a from the upper surface of the sealing resin 8 and extends vertically upwards. In other words, the insulated circuit board (1, 2, 3a, 3b), the first lower base member 5a, and the second lower base member 5b are simultaneously sealed in the sealing resin 8 and the first pin 7a and the second pin 7b are partially sealed with the exception of the respective upper portions of the first pin 7a and the second pin 7b. In FIG. 1, the height of the upper end of the first pin 7a having a length $d_a$ is substantially aligned with the height of the upper end of the second pin 7b having a length $d_b$. However, the lower end of the first pin 7a is lower than the lower end of the second pin 7b in the sealing resin 8.

The configuration of the first lower base member 5a, the first upper slide support member 6a, and the first pin 7a on the left side in FIG. 1 and the configuration of the second lower base member 5b, the second upper slide support member 6b, and the second pin 7b symmetrically positioned on the right side are equivalent to each other with the exception of the lengths of the pins. Accordingly, the configuration of the first lower base member 5a, the configuration of the first upper slide support member 6a, and the configuration of the first pin 7a will be described below with reference to the combination of the first lower base member 5a, the first upper slide support member 6a, and the first pin 7a as a representative example, and description of overlapping parts will be omitted with regard to the combination of the second lower base member 5b, the second upper slide support member 6b, and the second pin 7b.

In the state as a semiconductor module that is illustrated in FIG. 1, the first upper slide support member 6a is integrated with the first lower base member 5a by the sealing resin 8 disposed around the first upper slide support member 6a, and thus has a fixed and unchanging relative position. However, in a semiconductor module assembly stage preceding sealing with the sealing resin 8, the first upper slide support member 6a is merely press-fitted and inserted inside the first hole portion 5a1 of the first lower base member 5a. The first upper slide support member 6a is smoothly slidable in the upper-lower direction inside the first hole portion 5a1 without firm bonding using a bonding material such as solder.

A constant compressive force is applied from the inner wall surface of the first hole portion 5a1 to the outside surface of the first upper slide support member 6a fitted inside the first hole portion 5a1. The magnitude of the compressive force is controlled such that the first upper slide support member 6a holds its height position in the upper-lower direction and, in a case where a force equal to or greater than a certain magnitude is applied downwards from above, the height of the first upper slide support member 6a changes as a result of downward sliding. The control can be executed via adjustment of the diameter R1 of the first upper slide support member 6a, the diameter of the first hole portion 5a1 into which the first upper slide support member 6a is fitted, the roughness of the outside surface of the first upper slide support member 6a and the inner wall surface of the first hole portion 5a1 in contact with the outside surface, and the like. Accordingly, inside the first hole portion 5a1 of the first lower base member 5a, the first upper slide support member 6a is capable of sliding in the upper-lower direction by using the lower gap 9a.

In the state that is illustrated in FIG. 1, the first pin 7a and the first upper slide support member 6a are integrated with each other by the sealing resin 8, and thus have fixed and unchanging relative positions. However, before sealing with the sealing resin 8, the first pin 7a also is merely press-fitted and inserted inside the first upper slide support member 6a and a bonding material such as solder is not used. Accordingly, the first pin 7a is smoothly slidable in the upper-lower direction inside the tube of the first upper slide support member 6a.

A constant compressive force is applied from the inside surface of the first upper slide support member 6a to the outside surface of the first pin 7a fitted inside the first upper slide support member 6a. The magnitude of the compressive force is controlled such that the first pin 7a holds its height position in the upper-lower direction and, in a case where a force equal to or greater than a certain magnitude is applied downwards from above, the height of the first pin 7a changes as a result of downward sliding. The control can be executed via adjustment of the diameter R2 of the first pin 7a, the inner diameter of the tube of the first upper slide support member 6a into which the first pin 7a is fitted, the roughness of the outside surface of the first pin 7a, the roughness of the inside surface of the first upper slide support member 6a in contact with the outside surface, and the like. Accordingly, also inside the first upper slide support member 6a supported by the first lower base member 5a, the first pin 7a is capable of sliding in the upper-lower direction by using the lower gap 9a.

In other words, inside the first hole portion 5a1, the first pin 7a is displaced downwards toward the gap 9a by a downward force being applied with respect to the upper portion of the first pin 7a, and then the relative position with respect to the first upper slide support member 6a can be changed. At this time, the first upper slide support member 6a also can be slid inside the first hole portion 5a1 and displaced downwards. By at least one of the first pin 7a and the first upper slide support member 6a being displaced downwards, the protruding length h of the first pin 7a on the sealing resin 8 is adjusted to a desired length. Likewise, also in the combination of the second lower base member 5b, the second upper slide support member 6b, and the second pin 7b, a downward force is applied with respect to the upper portion of the second pin 7b inside the second hole portion 5b1, and thus at least one of the second pin 7b and the second upper slide support member 6b is displaced downwards and the protruding length h is adjusted to a desired length.

Accordingly, in the semiconductor module illustrated in FIG. 1, the protruding height h of the first pin 7a on the sealing resin 8 and the protruding height h of the second pin 7b on the sealing resin 8 are adjusted to be evenly aligned in accordance with a design specification value even if the first pin 7a and the second pin 7b with different lengths are used. In FIG. 1, the length $d_a$ of the first pin 7a and the length $d_b$ of the second pin 7b are illustrated in an exaggerated manner so that the difference between the two is emphasized for descriptive purposes.

—Semiconductor Module Manufacturing Method—

Figure 2:
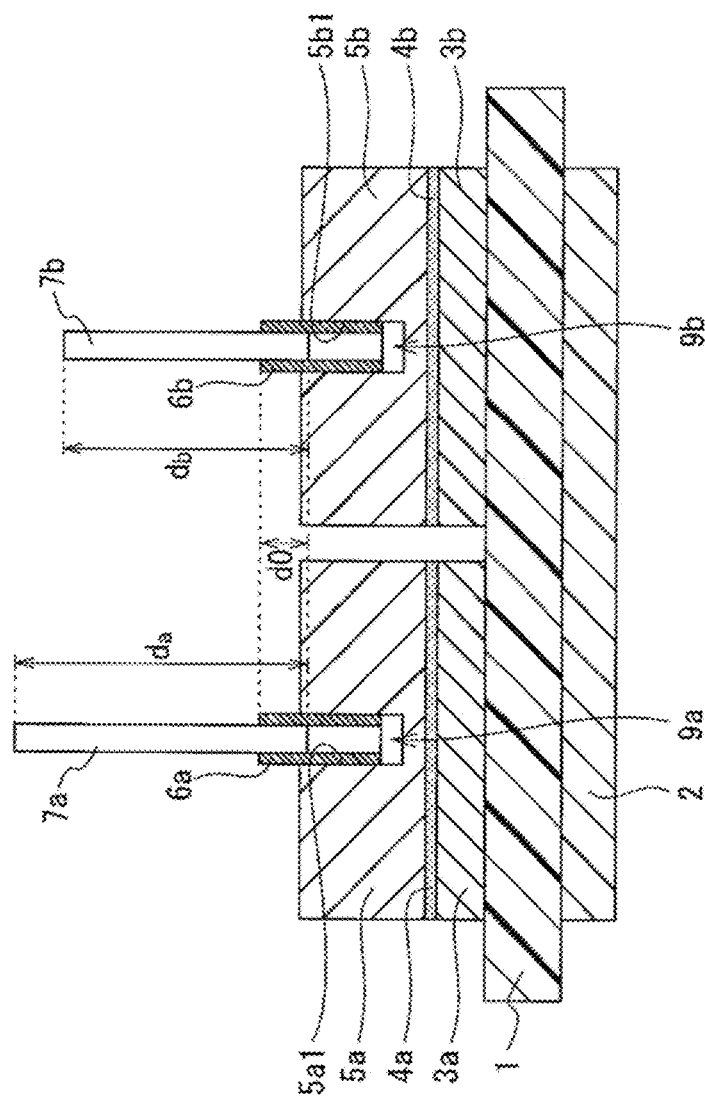
FIG. 2 is a (first) cross-sectional view schematically illustrating the outline of a semiconductor module manufacturing method according to the embodiment of the invention.

Next, a semiconductor module manufacturing method according to the embodiment of the invention will be described with reference to FIGS. 2 to 5. First, as illustrated in FIG. 2, the first lower base member 5a and the second lower base member 5b are prepared on the insulated circuit board (1, 2, 3a, 3b) with the first hole portion 5a1 and the second hole portion 5b1 respectively provided at a certain depth after prior machining and the like. The prepared first lower base member 5a and the second lower base member 5b are bonded onto the first surface conductive layer 3a and the second surface conductive layer 3b via the bonding layers 4a and 4b formed by solder and the like.

Next, the lower portion of the tubular first upper slide support member 6a is inserted and press-fitted inside the first hole portion 5a1 of the first lower base member 5a and fitted and attached inside the first hole portion 5a1. Likewise, the lower portion of the second upper slide support member 6b is inserted and press-fitted inside the second hole portion 5b1 of the second lower base member 5b and fitted and attached inside the second hole portion 5b1. As a result of the fitting, the outside surface of the first upper slide support member 6a comes into contact with the inside wall of the first hole portion 5a1 and the outside surface of the second upper slide support member 6b comes into contact with the inside wall of the second hole portion 5b1.

Next, the first pin 7a is inserted and press-fitted inside the tube of the first upper slide support member 6a and fitted and slidably attached inside the first upper slide support member 6a. Likewise, the second pin 7b is inserted and press-fitted inside the tube of the second upper slide support member 6b and fitted and slidably attached inside the second upper slide support member 6b. The gaps 9a and 9b are formed between the lower end of the first pin 7a and the bottom of the first hole portion 5a1 and between the lower end of the second pin 7b and the bottom of the second hole portion 5b1, respectively.

In a case where the first pin 7a and the second pin 7b are automatically inserted by means of a pin insertion device and the like, any pin is inserted at a constant insertion depth d0 set in the pin insertion device. Here, as illustrated in FIG. 2, the length $d_a$ of the first pin 7a is slightly greater than the length $d_b$ of the second pin 7b by approximately 100 μm. Accordingly, the upper end of the first pin 7a is higher than the upper end of the second pin 7b when the insulated circuit board (1, 2, 3a, 3b) is disposed on a flat surface with the first pin 7a and the second pin 7b inserted.

Figure 3:
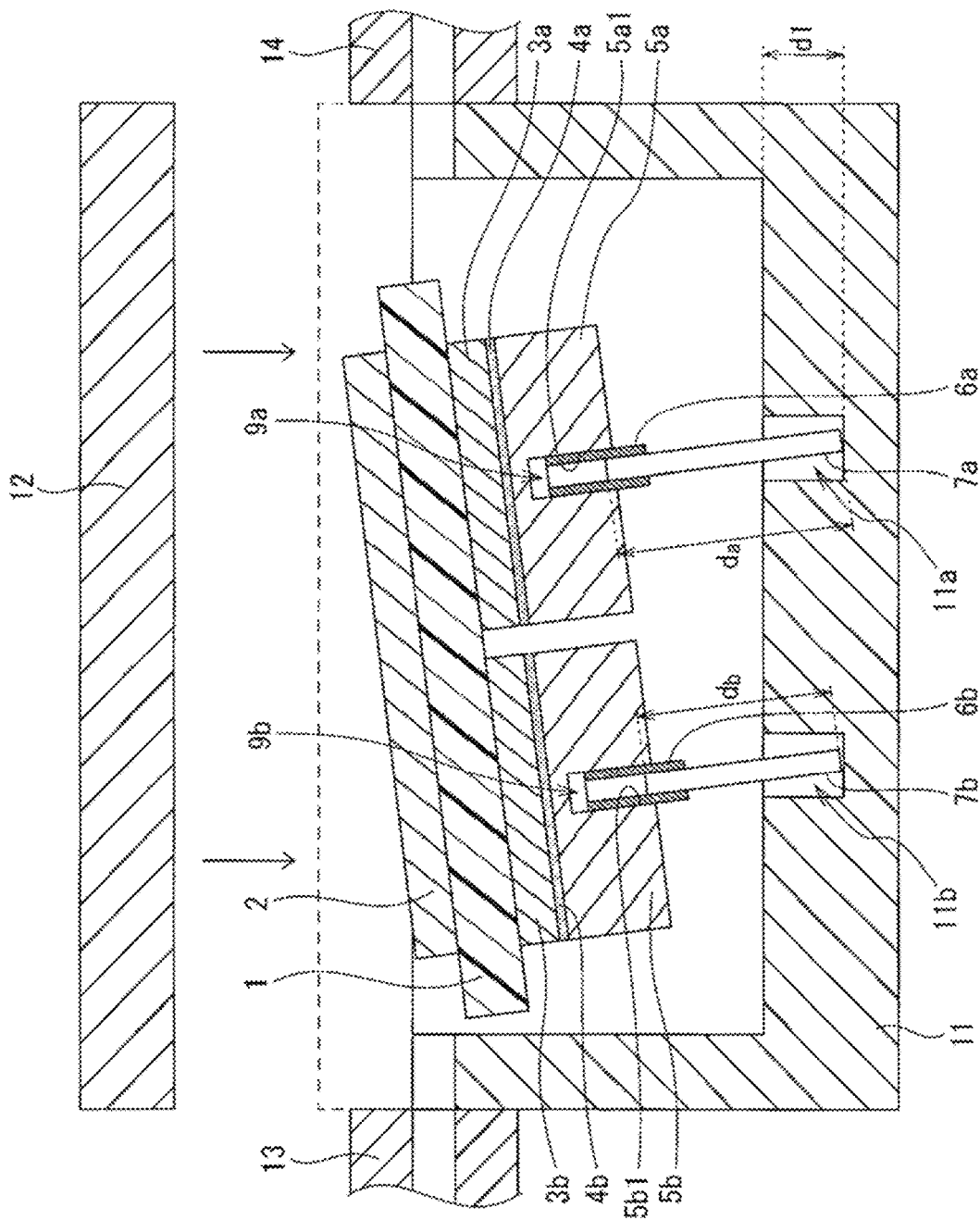
FIG. 3 is a (second) cross-sectional view schematically illustrating the outline of the semiconductor module manufacturing method according to the embodiment of the invention.

Next, the insulated circuit board (1, 2, 3a, 3b) is conveyed to a transfer molding apparatus with the first pin 7a and the second pin 7b inserted. As illustrated in FIG. 3, the transfer molding apparatus according to the embodiment of the invention is provided with a box-shaped product portion (11, 12) into which molten resin is poured. The product portion (11, 12) has a pot-shaped lower mold 11 forming a first mold and a lid-shaped upper mold 12 forming a second mold and provided on the lower mold 11. An internal space is formed as the upper mold 12 covers the lower mold 11 from above and both are integrated with each other. A bottomed first recessed portion 11a and a bottomed second recessed portion 11b are provided in the bottom portion of the lower mold 11, and the first recessed portion 11a and the second recessed portion 11b are provided with the same depth d1.

A runner communicating with the internal space of the product portion (11, 12) is connected and provided upstream of the product portion (11, 12), and a connecting portion 13 for the product portion (11, 12) is illustrated on the left side of the product portion (11, 12) in FIG. 3. Provided along with a driving device and the like upstream of the connecting portion 13 are a pot accumulating the resin to be poured into the product portion (11, 12) and an extruding plunger extruding the resin accumulated inside the pot and injecting the resin into the product portion (11, 12). The pot, the extruding plunger, the driving device, and the like are not illustrated.

Connected and provided downstream of the product portion (11, 12) is a resin pool communicating with the internal space of the product portion (11, 12) and storing the resin flowing out from the product portion (11, 12). A connecting portion 14 for the product portion (11, 12) is illustrated on the right side of the product portion (11, 12) in FIG. 3. The resin pool positioned downstream of the connecting portion 14 is not illustrated.

Next, the insulated circuit board (1, 2, 3a, 3b) is disposed as an insert part inside the product portion (11, 12) of the transfer molding apparatus such that the back surface conductive layer 2 is positioned on the upper mold 12 side with the top and bottom inverted from the case illustrated in FIG. 2. The upper mold 12 abuts against the back surface conductive layer 2. In the bottom portion of the lower mold 11, the bottom portions of the first recessed portion 11a and the second recessed portion 11b abut against the respective upper ends of the first pin 7a and the second pin 7b (lower ends in FIG. 3).

Here, the first recessed portion 11a and the second recessed portion 11b of the lower mold 11 are provided with an opening width exceeding the diameters of the first pin 7a and the second pin 7b at positions against which the upper ends of the first pin 7a and the second pin 7b (lower ends in FIG. 3) abut. Accordingly, the upper ends of the first pin 7a and the second pin 7b (lower ends in FIG. 3) are inserted well inside the first recessed portion 11a and the second recessed portion 11b of the lower mold 11. The length $d_a$ of the first pin 7a and the length $d_b$ of the second pin 7b differ from each other. Accordingly, once the first pin 7a and the second pin 7b with different lengths are respectively inserted into the first recessed portion 11a and the second recessed portion 11b having the same depth d1, the flat lower surface of the back surface conductive layer 2 (upper surface in FIG. 3) is inclined with respect to the horizontal bottom surface of the lower mold 11. With the semiconductor module inclined in this manner, the upper mold 12 of the product portion (11, 12) approaches and covers the lower mold 11.

Figure 4:
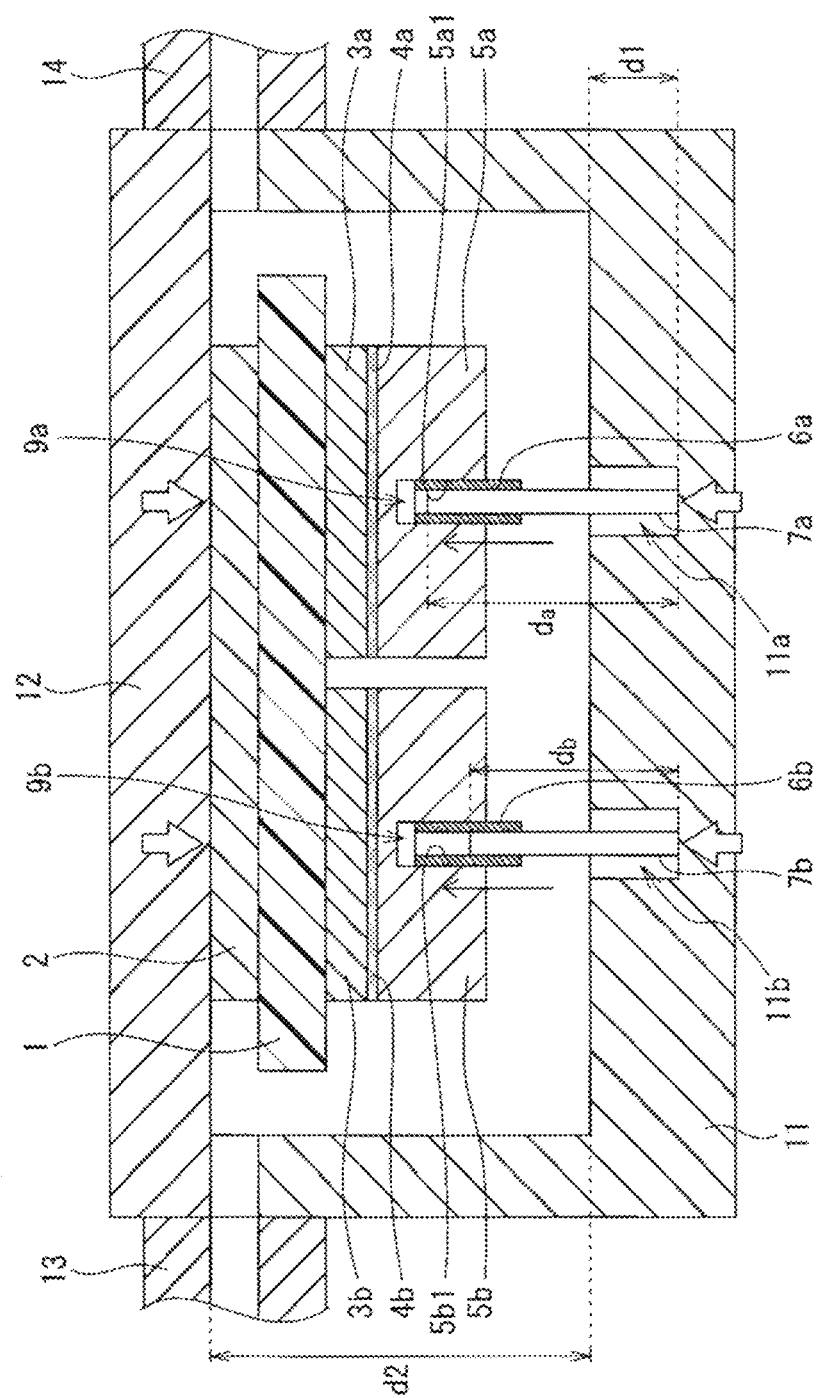
FIG. 4 is a (third) cross-sectional view schematically illustrating the outline of the semiconductor module manufacturing method according to the embodiment of the invention.

Next, as illustrated in FIG. 4, the upper mold 12 and the lower mold 11 are integrally fixed and the internal space is sealed. Here, a distance d2 between the lower surface of the upper mold 12 and the upper surface of the lower mold 11 is set in accordance with the height of the sealing resin 8 following solidification of the semiconductor module illustrated in FIG. 1. The depth d1 of the first recessed portion 11a and the second recessed portion 11b of the lower mold 11 is set in accordance with the protruding height h of the first pin 7a and the second pin 7b on the sealing resin 8 following the solidification. Accordingly, the length between the upper end of the first pin 7a (lower end in FIG. 3) and the lower surface of the back surface conductive layer 2 (upper surface in FIG. 3) of the insulated circuit board (1, 2, 3a, 3b) prior to insertion depth adjustment exceeds the sum of the depth d1 of the first recessed portion 11a and the distance d2, which is the height of the internal space.

As the upper mold 12 and the lower mold 11 are held in an integrated state, a downward force is applied to the insulated circuit board (1, 2, 3a, 3b) via the lower surface of the upper mold 12 abutting against the lower surface of the back surface conductive layer 2 (upper surface in FIG. 3). This downward force causes the slidable first lower base member 5a and first upper slide support member 6a to pushed toward the first pin 7a on the lower side in FIG. 3. Relatively, the first pin 7a is inserted toward the gap 9a inside the first upper slide support member 6a on the upper side in FIG. 3. At the same time, an upward force is applied to the first pin 7a via the bottom surface of the first recessed portion 11a of the lower mold 11 abutting against the upper end of the first pin 7a (lower end in FIG. 3). This upward force causes the slidable first pin 7a to be pushed toward the gap 9a in the bottom portion of the first hole portion 5a1 of the first lower base member 5a on the upper side in FIG. 3.

The first pin 7a starts to slide to the upper side in FIG. 4 when the downward force from the upper mold 12 and the upward force from the lower mold 11 integrally act on the first pin 7a and exceed the compressive force maintaining the fitted state between the first pin 7a and the first upper slide support member 6a. Once the length of the part of the upper portion of the first pin 7a (lower portion in FIG. 4) that protrudes downwards from the upper surface of the lower mold 11 reaches the same length as the depth d1 of the first recessed portion 11a as a result of the upward movement of the first pin 7a, the forces from the upper mold 12 and the lower mold 11 that are applied to the first pin 7a disappear. At the point in time when the first pin 7a stops moving as a result of the disappearance of the forces applied to the first pin 7a, the insertion depth of the first pin 7a to the inside of the first upper slide support member 6a is adjusted to a preset insertion depth.

Simultaneously with the first pin 7a, the second pin 7b slides inside the second upper slide support member 6b toward the gap 9b of the second hole portion 5b1 of the second lower base member 5b as the upper mold 12 approaches and is integrally fixed to the lower mold 11. As in the case of the first pin 7a, once the length of the part of the upper portion of the second pin 7b in FIG. 4 (lower portion in FIG. 4) that protrudes downwards from the upper surface of the lower mold 11 reaches the same length as the depth d1 of the second recessed portion 11b, the forces from the upper mold 12 and the lower mold 11 that are applied to the second pin 7b disappear. The insertion depth of the second pin 7b to the inside of the second upper slide support member 6b also is adjusted to a preset insertion depth.

Figure 5:
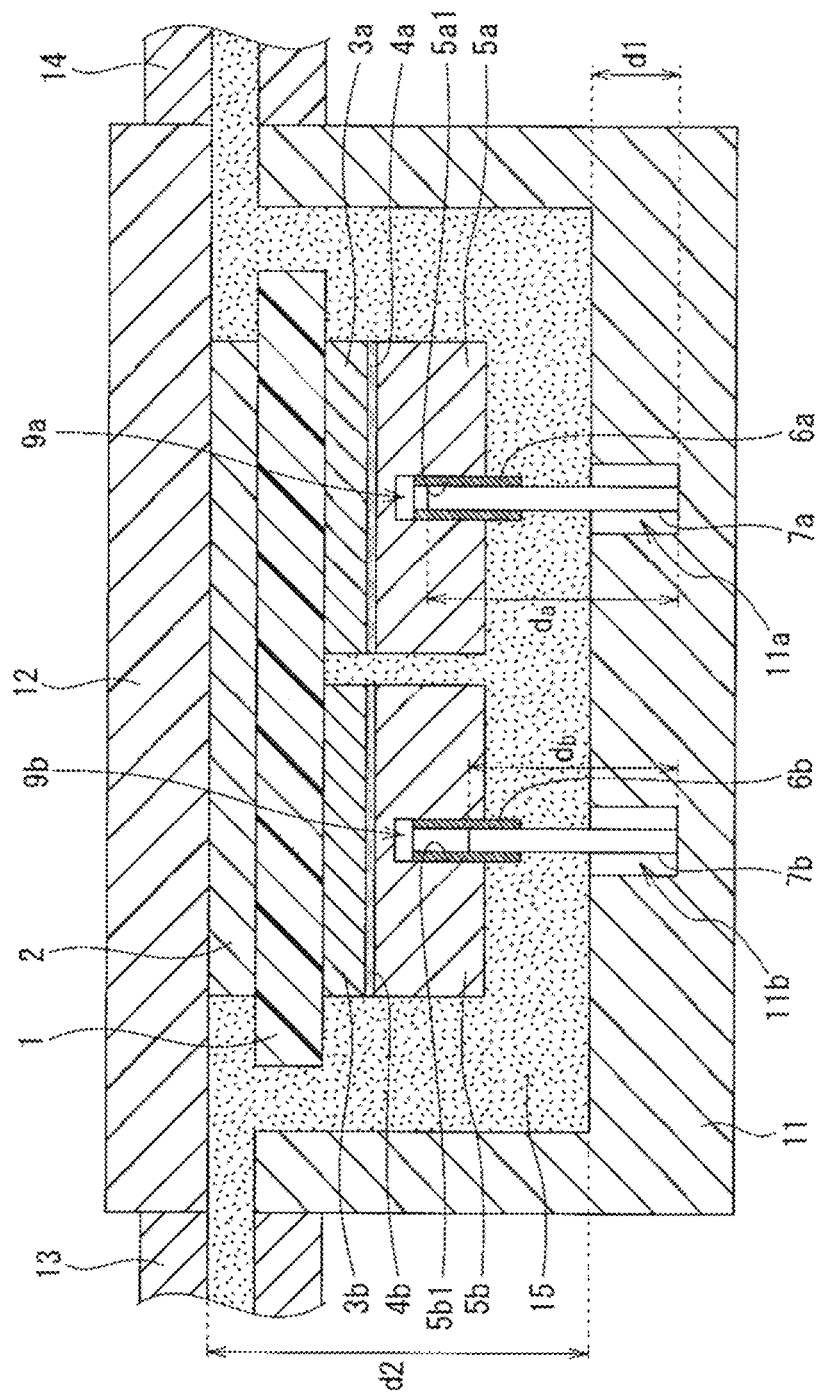
FIG. 5 is a (fourth) cross-sectional view schematically illustrating the outline of the semiconductor module manufacturing method according to the embodiment of the invention.

Next, as illustrated in FIG. 5, molten resin 15 is injected into the internal space of the product portion (11, 12) after the protruding length of the upper portions of the first pin 7a and the second pin 7b (lower portions in FIG. 5) from the upper surface of the lower mold 11 reaches the same length as the depth d1 of the first recessed portion 11a and the second recessed portion 11b. Then, a predetermined holding pressure is applied to the sealed internal space and the injected resin 15 is solidified. Subsequently, the product portion (11, 12) is opened and a resin sealing body in which the insulated circuit board (1, 2, 3a, 3b) is sealed is taken out from the product portion (11, 12). Then, predetermined shaping processing and the like are applied to the resin sealing body so that extra resin and the like are removed. As a result of the above processes, the semiconductor module illustrated in FIG. 1, in which the insulated circuit board (1, 2, 3a, 3b), the first lower base member 5a, the second lower base member 5b, the first upper slide support member 6a, and the second upper slide support member 6b are sealed, can be obtained.

In the obtained semiconductor module, the first pin 7a and the second pin 7b, which are external connection terminals, are sealed in the sealing resin 8 with the exception of the upper portions of the first pin 7a and the second pin 7b. Even if the lengths of the first pin 7a and the second pin 7b differ from each other before integral molding, the protruding heights of the first pin 7a and the second pin 7b on the sealing resin 8 can be accurately and uniformly aligned in accordance with a prescribed design specification value after the integral molding.

In the semiconductor module according to the embodiment of the invention, the first upper slide support member 6a and the second upper slide support member 6b are first inserted into the first hole portion 5a1 and the second hole portion 5b1 of the first lower base member 5a and the second lower base member 5b attached on the insulated circuit board (1, 2, 3a, 3b), respectively. Further, the first pin 7a and the second pin 7b are inserted inside the first upper slide support member 6a and the second upper slide support member 6b in the first-stage sliding structure, and a second-stage sliding structure is realized as a result. Accordingly, the protruding length h of the first pin 7a and the second pin 7b on the sealing resin 8 can be adjusted to a certain length and with ease simply by the first pin 7a and the second pin 7b being pushed toward the lower sides of the first upper slide support member 6a and the second upper slide support member 6b. Therefore, it is possible to realize a high-quality semiconductor module in which the pin protruding length h is controlled so as to conform to a product specification value.

Since the lower surface of the first lower base member 5a is a flat block, the first lower base member 5a is stably bonded to the insulated circuit board (1, 2, 3a, 3b) on the lower side, and the positional accuracy of the first pin 7a is enhanced. The tubular first upper slide support member 6a is provided upright on the upper side of the first lower base member 5a via the first hole portion 5a1, and thus a height required for supporting the first pin 7a is earned. In other words, in the lower portion of the first pin 7a, a region corresponding to a height required for stable support is ensured by the first upper slide support member 6a being combined instead of being ensured by the block-shaped first lower base member 5a alone. Accordingly, by using the first upper slide support member 6a of the diameter R1 narrower than the width w of the first lower base member 5a, the thickness of the first lower base member 5a can be suppressed and a simple shape becomes adoptable. The second lower base member 5b, the second upper slide support member 6b, the second hole portion 5b1, and the second pin 7b are similarly combined with respectively corresponding left-side members. Accordingly, an increase in thickness can be suppressed and a simple shape can be adopted for the second lower base member 5b as is the case with the first lower base member 5a. Therefore, a significant reduction in manufacturing cost can be achieved.

The tubular first upper slide support member 6a is used in combination with the first hole portion 5a1. Accordingly, the range of the adjustment can be wider than in a case where the protruding height h is adjusted by the first pin 7a being inserted into the first hole portion 5a1 alone. The same applies to the second upper slide support member 6b.

From empirical rules, in the semiconductor module according to the embodiment of the invention, the width w of the first lower base member 5a and the second lower base member 5b is controlled so as to be at least three times the diameter R1 of the first upper slide support member 6a and the second upper slide support member 6b. Accordingly, it is possible to more efficiently realize positional accuracy improvement for the first pin 7a and the second pin 7b and bondability for the insulated circuit board (1, 2, 3a, 3b) at the same time. In addition, the thickness t of the first lower base member 5a and the second lower base member 5b is controlled to 300 μm or more and 1 mm or less, and thus it is possible to efficiently realize manufacturing cost reduction and positional accuracy improvement for the first pin 7a and the second pin 7b at the same time.

The first lower base member 5a and the second lower base member 5b are not only capable of responding to pins given different lengths during manufacturing as a result of cutting and the like but also applicable in a case where a plurality of pins having different lengths in terms of design are arranged side by side on the same insulated circuit board (1, 2, 3a, 3b). In other words, the lower base members can be commonly used for various pins, and thus the lower base members are highly versatile as parts and highly cost-effective.

The block-shaped first lower base member 5a and second lower base member 5b are bonded to the insulated circuit board (1, 2, 3a, 3b) via flat lower surfaces. Accordingly, a larger bonding area can be ensured with respect to the insulated circuit board (1, 2, 3a, 3b) than in a method by which, for example, a cylindrical support member is directly soldered onto the insulated circuit board (1, 2, 3a, 3b) via a ring-shaped lower surface. Accordingly, the amount of solder used for bonding between the first lower base member 5a and the second lower base member 5b can be controlled with higher accuracy, and the thickness of the solder layer to be the bonding layers 4a and 4b can be formed with ease and constancy. As a result, inclination of the first lower base member 5a and the second lower base member 5b and inclination of the first upper slide support member 6a inserted on the upper side are suppressed. Then, inclination of the first pin 7a inserted inside the first upper slide support member 6a is also suppressed, and the first pin 7a is capable of standing upright. The same applies to the second pin 7b. Accordingly, the upper ends of the first pin 7a and the second pin 7b on the sealing resin 8 can be accurately positioned even in a planar pattern.

In the semiconductor module according to the embodiment of the invention, the first upper slide support member 6a and the second upper slide support member 6b are cylindrical and have a simple structure suitable for mass production, and thus are highly cost-effective.

In the semiconductor module according to the embodiment of the invention, each of the first hole portion 5a1 and the second hole portion 5b1 formed in the upper portions of the first lower base member 5a and the second lower base member 5b is bottomed, and no through hole leads to the lower surfaces of the first lower base member 5a and the second lower base member 5b. In a case where the hole portion is a through hole and the first lower base member 5a and the second lower base member 5b are solder-bonded to the insulated circuit board (1, 2, 3a, 3b), solder jumping during reflow may cause a solder member to intrude into the hole portion and the solder member may adhere to the lower portion of the pin and interfere with the pin. In the semiconductor module according to the embodiment of the invention, however, each of the first hole portion 5a1 and the second hole portion 5b1 is bottomed, and thus intrusion of a solder member can be reliably prevented and interference of a solder member with the first pin 7a and the second pin 7b can be avoided.

In the semiconductor module according to the embodiment of the invention, the first upper slide support member 6a is merely fitted into the first hole portion 5a1 of the first lower base member 5a, and there is no solder layer between the first upper slide support member 6a and the first lower base member 5a. Here, when a cylindrical columnar electrode is directly soldered onto a circuit pattern as in PTL 6, the height of the columnar electrode may change due to an uneven solder layer thickness. It is extremely difficult to correct such a change in height during resin sealing, and thus a deterioration in the quality of a product obtained after resin sealing is inevitable.

Further, when a solder layer is formed such that a projecting portion provided in the bottom portion of the cylindrical member is interposed inside as in PTL 7, resin sealing may be followed by peeling staring from the boundary between the solder on a cylindrical member-bonded bottom surface and surrounding sealing resin. A deterioration in semiconductor module characteristics arises once this peeling reaches the upper end of the cylindrical member after proceeding from the bottom surface along the boundary between the outside surface of the cylindrical member and the sealing resin. In the semiconductor module according to the embodiment of the invention, however, no solder layer is used for bonding between the first upper slide support member 6a and the first lower base member 5a, and thus a change in the height of the first upper slide support member 6a attributable to an uneven solder layer thickness can be avoided. Also, a change in the height of the second upper slide support member 6b attributable to an uneven solder layer thickness can be avoided as is the case with the first upper slide support member 6a.

In the semiconductor module manufacturing method according to the embodiment of the invention, the upper ends of the first pin 7a and the second pin 7b are pushed downwards via the inner surface of a mold used during integral molding. Accordingly, the protruding lengths of the first pin 7a and the second pin 7b can be automatically adjusted without manual labor, and thus manufacturing efficiency enhancement can be achieved.

In the semiconductor module manufacturing method according to the embodiment of the invention, the lower mold 11 is used that has the first recessed portion 11a and the second recessed portion 11b respectively corresponding to the first pin 7a and the second pin 7b. As the recessed portions as pin pushing portions are provided in advance on the inner wall of the mold to correspond to the pins as described above, the protruding lengths of all of the pins provided on the insulated circuit board (1, 2, 3a, 3b) can be simultaneously adjusted through single matching during integral molding.

The plurality of recessed portions may have different depths as well although the protruding lengths of the first pin 7a and the second pin 7b are aligned to the same length as the depth d1 of the first recessed portion 11a and the second recessed portion 11b in FIGS. 3 to 5. In other words, according to the invention, it is possible not only to uniformly align all of the protruding lengths of the pins extending from the semiconductor module but also to control the protruding lengths of the pins in any manner for each pin by individually adjusting the depths of the recessed portions.

First Modification Example

Figure 6:
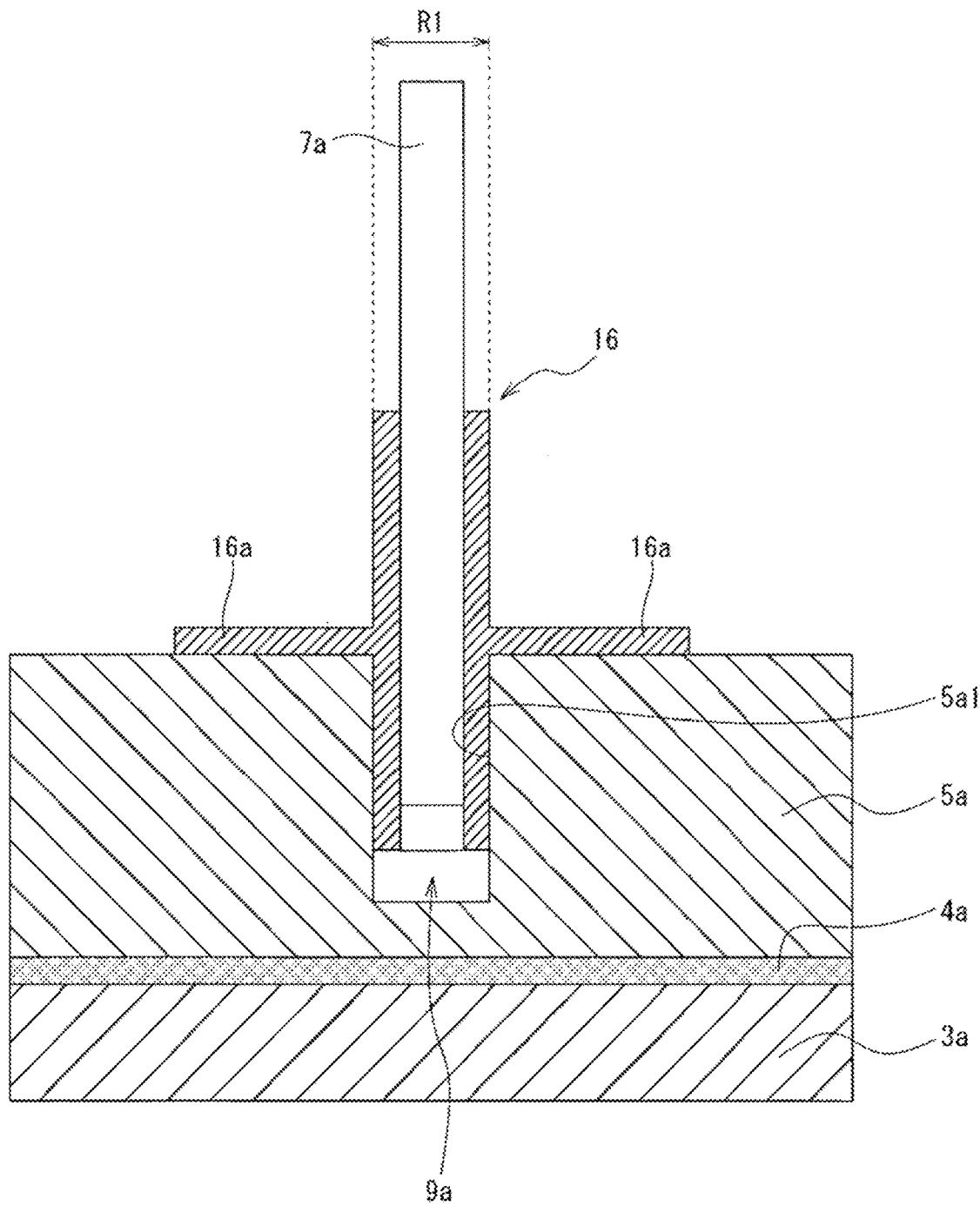
FIG. 6 is a cross-sectional view schematically illustrating the outline of the configuration of a first upper slide support member used in a semiconductor module according to a first modification example of the embodiment of the invention.

As illustrated in FIG. 6, in a semiconductor module according to a first modification example of the embodiment of the invention, a first upper slide support member 16 has a flange 16a provided on the outside surface of a tubular main body and protruding in a direction (right-left direction in FIG. 6) orthogonal to the axial direction of the tube. The flange 16a is provided at a substantially central height between the upper end and the lower end of the tubular main body. The width of the flange 16a in the right-left direction in FIG. 6 exceeds the width of the diameter R1 of the first hole portion 5a1. The lower surface of the flange 16a is in contact with the upper surface of the first lower base member 5a. The flange 16a limits downward sliding of the first upper slide support member 16 inside the first hole portion 5a1, and thus the flange 16a functions as a stopper. The other configurations of the semiconductor module according to the first modification example are equivalent to the respective members having the same names in the semiconductor module described with reference to FIGS. 1 to 5, and thus repetitive description will be omitted here.

In the semiconductor module according to the first modification example, a wide region of contact is ensured with respect to the upper surface of the first lower base member 5a by the lower surface of the flange 16a, and thus integration between the first upper slide support member 16 and the first lower base member 5a can be further improved. The other effects of the semiconductor module according to the first modification example are the same as those of the semiconductor module described with reference to FIGS. 1 to 5.

Second Modification Example

Figure 7:
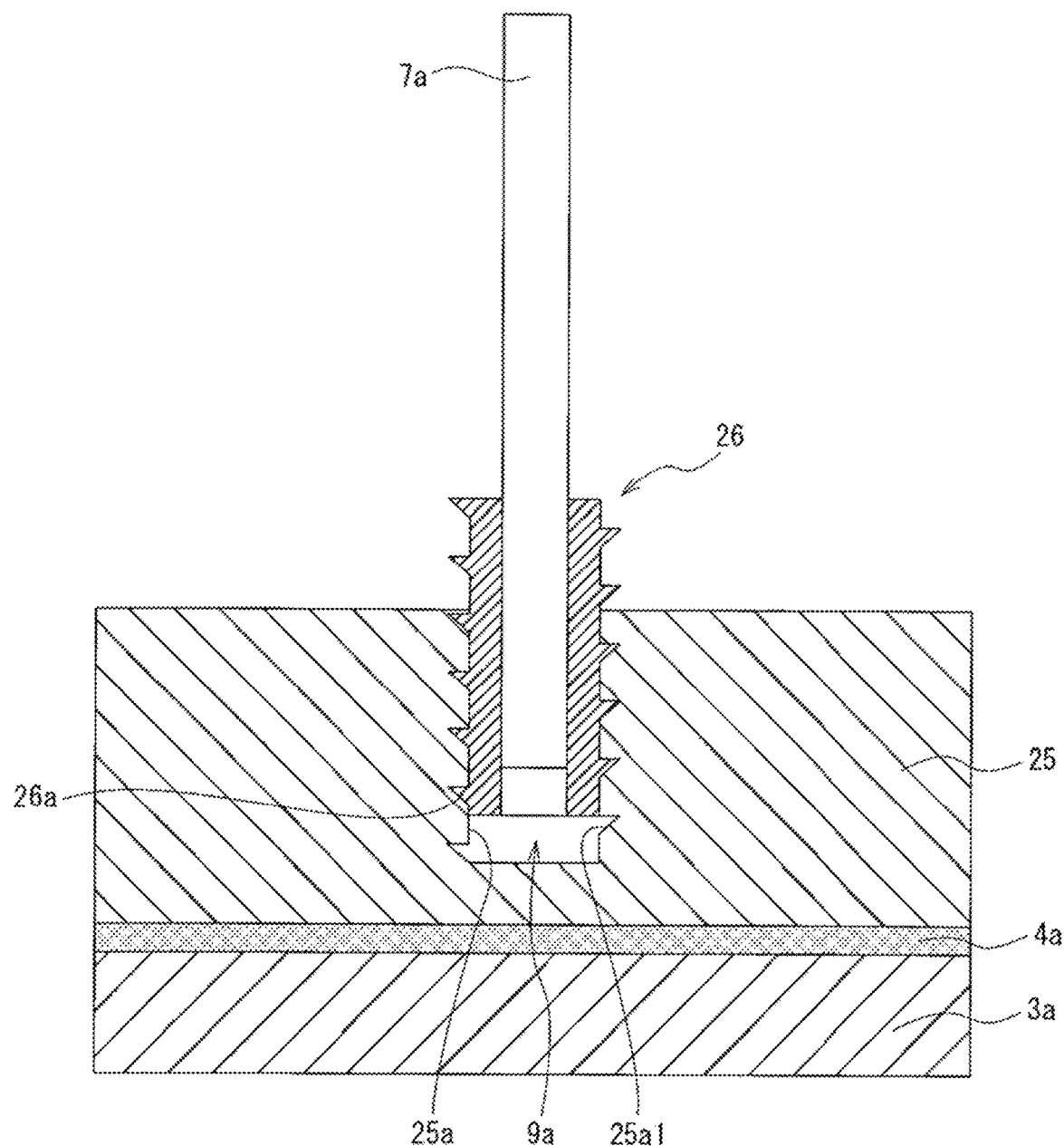
FIG. 7 is a cross-sectional view schematically illustrating the outline of the configuration of a first hole portion and a first upper slide support member used in a semiconductor module according to a second modification example of the embodiment of the invention.

As illustrated in FIG. 7, in a semiconductor module according to a second modification example of the embodiment of the invention, a bottomed first hole portion 25a is provided in the upper portion of a first lower base member 25, and a female screw portion 25a1 is formed as a spiral groove in the inside wall of the first hole portion 25a. The female screw portion 25a1 can be manufactured by processing of the inside wall of a pilot hole to be the first hole portion 25a by means of a tap and the like.

A first upper slide support member 26 has a male screw portion 26a provided on the outside surface of the tubular main body so as to spirally extend downwards from above. The male screw portion 26a is engaged with the female screw portion 25a1 of the first hole portion 25a of the first lower base member 25 and forms the "engagement portion" of the invention. The female screw portion 25a1 can be manufactured by processing of the outside surface of the tubular main body of the first upper slide support member 26 by means of a dice and the like. The other configurations of the semiconductor module according to the second modification example are equivalent to the respective members having the same names in the semiconductor module described with reference to FIGS. 1 to 5, and thus repetitive description will be omitted here.

In the semiconductor module according to the second modification example, the female screw portion 25a1 of the first hole portion 25a of the first lower base member 25 and the male screw portion 26a of the first upper slide support member 26 are screw-coupled. As a result, integration between the first lower base member 25 and the first upper slide support member 26 can be further improved. The other effects of the semiconductor module according to the second modification example are the same as those of the semiconductor module described with reference to FIGS. 1 to 5.

Third Modification Example

Figure 8A:
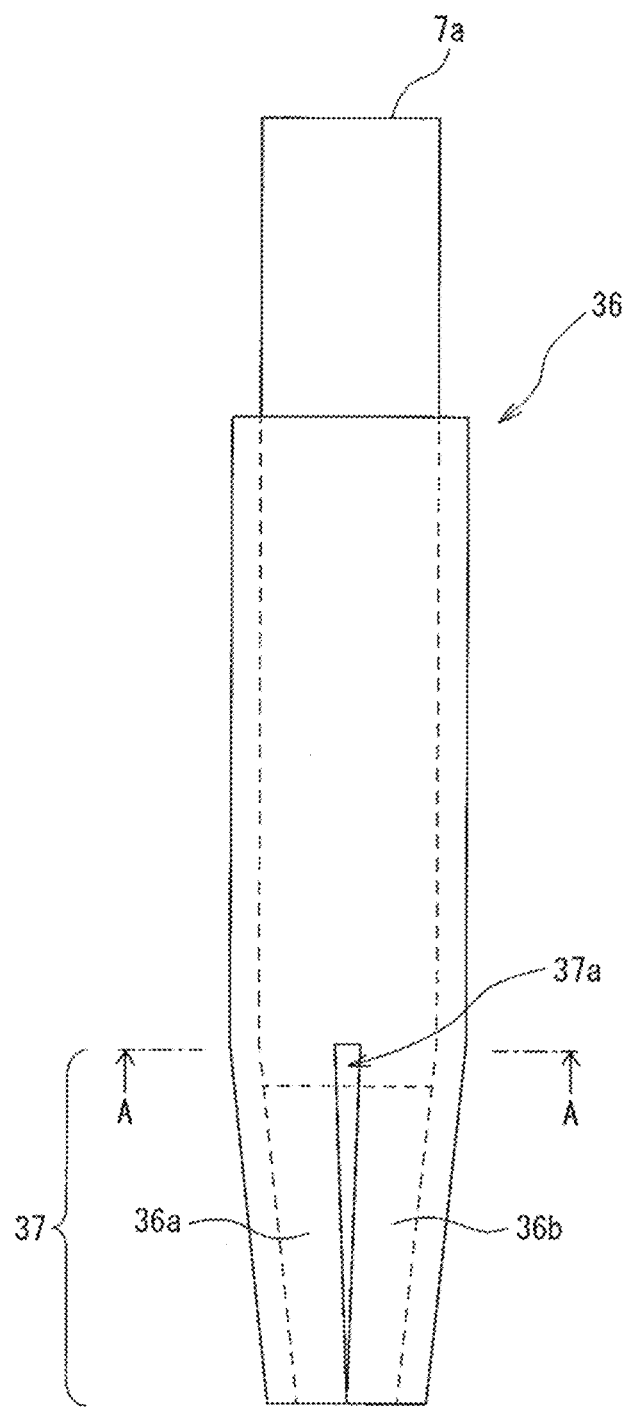
FIG. 8A is a front view schematically illustrating the outline of the configuration of a first upper slide support member used in a semiconductor module according to a third modification example of the embodiment of the invention.
Figure 8B:
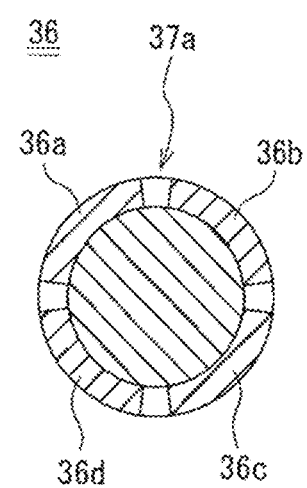
FIG. 8B is a cross-sectional view taken along line A-A of FIG. 8A.

As illustrated in FIGS. 8A and 8B, in a semiconductor module according to a third modification example of the embodiment of the invention, a slit portion 37 having a plurality of slits 37a is provided in the lower portion of a cylindrical first upper slide support member 36. The slits 37a of the first upper slide support member 36 extend along the upper-lower direction in FIG. 8A, and four slits 37a are formed at substantially equal intervals and with the same width along the circumferential direction of the cylinder as illustrated in FIG. 8B. Accordingly, the slit portion 37 of the first upper slide support member 36 is divided into four by the four slits 37a, and four divided regions 36a to 36d are illustrated in FIG. 8B.

As illustrated in FIG. 8A, the four divided regions 36a to 36d are deflected and bent inwards toward the central axis of the cylinder and toward the lower end between the upper and lower ends of the slits 37a. The lower ends of the divided regions 36a to 36d are in contact with each other in the end portions of the divided regions 36a to 36d that are adjacent to each other. Accordingly, as can be seen from FIG. 8A, the cylinder of the first upper slide support member 36 is constricted such that the diameter of the lower end is smaller than the diameter of the upper end formed between the facing surfaces. The first pin 7a inserted inside the first upper slide support member 36 has almost the same outer diameter as the inner diameter of the first upper slide support member 36. Accordingly, as illustrated in FIG. 8A, the lower portion of the first pin 7a is in contact with the inside surface of the region where the tube is constricted inside the lower portion of the first upper slide support member 36.

Once the first pin 7a slides downwards in the lower portion inside the first upper slide support member 36, the divided regions 36a to 36d are further deflected inwards by the sliding movement and a restoring force from the deflected divided regions 36a to 36d is applied to the first pin 7a. The other configurations of the semiconductor module according to the third modification example are equivalent to the respective members having the same names in the semiconductor module described with reference to FIGS. 1 to 5, and thus repetitive description will be omitted here.

In the semiconductor module according to the third modification example, the crimpability of the first upper slide support member 36 and the first pin 7a can be further improved by means of the restoring force from the deflected divided regions 36a to 36d in the lower portion of the first upper slide support member 36. The other effects of the semiconductor module according to the third modification example are the same as those of the semiconductor module described with reference to FIGS. 1 to 5.

Fourth Modification Example

Figure 9:
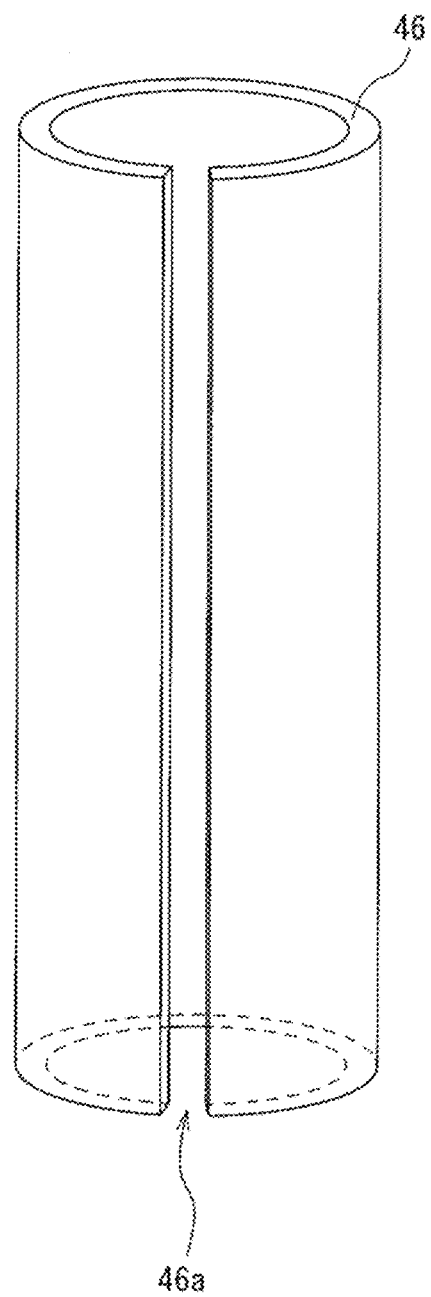
FIG. 9 is a perspective view (bird's eye view) schematically illustrating the outline of the configuration of a first upper slide support member used in a semiconductor module according to a fourth modification example of the embodiment of the invention.

As illustrated in FIG. 9, in a semiconductor module according to a fourth modification example of the embodiment of the invention, one slit 46a continuously stretching across both upper and lower ends is provided on the side wall of a cylindrical first upper slide support member 46. In a case where the first upper slide support member 46 is made of a material that generates a certain restoring force such as resin, for example, preparable as a cylinder member to be the main body is a cylinder member that has an inner diameter slightly smaller than the outer diameter of the first pin inserted inside the first upper slide support member 46. The slit 46a is formed by a notch being made in the side wall of the main body of the cylinder, and then a restoring force can be given with respect to the first pin inserted inside the first upper slide support member 46 from the inside surface of the first upper slide support member 46 in close contact.

As illustrated in FIG. 5, in a case where the molten resin 15 is poured during semiconductor module molding, air is moved to the outside via the slit 46a from the lower gap in the first upper slide support member 46 with respect to the first lower base member. The resin 15 can be poured into the gap as well. The other configurations of the semiconductor module according to the fourth modification example are equivalent to the respective members having the same names in the semiconductor module described with reference to FIGS. 1 to 5, and thus repetitive description will be omitted here.

In the semiconductor module according to the fourth modification example, the side wall of the tube of the first upper slide support member 46 is partially opened by the slit 46a extending in the upper-lower direction, and an elastic force is applied to the entire first upper slide support member 46. Then, the inner diameter of the first upper slide support member 46 is adjusted to be smaller than the outer diameter of the first pin, and thus a large restoring force can be applied to the first pin from the first upper slide support member 46 and crimpability with respect to the first pin can be improved. During semiconductor module molding, air removal from the gap is promoted by the slit 46a being used, and then the resin 15 can be easily injected. As a result, sealing resin-insulated circuit board integration can be enhanced. The other effects of the semiconductor module according to the fourth modification example are the same as those of the semiconductor module described with reference to FIGS. 1 to 5.

Fifth Modification Example

Figure 10:
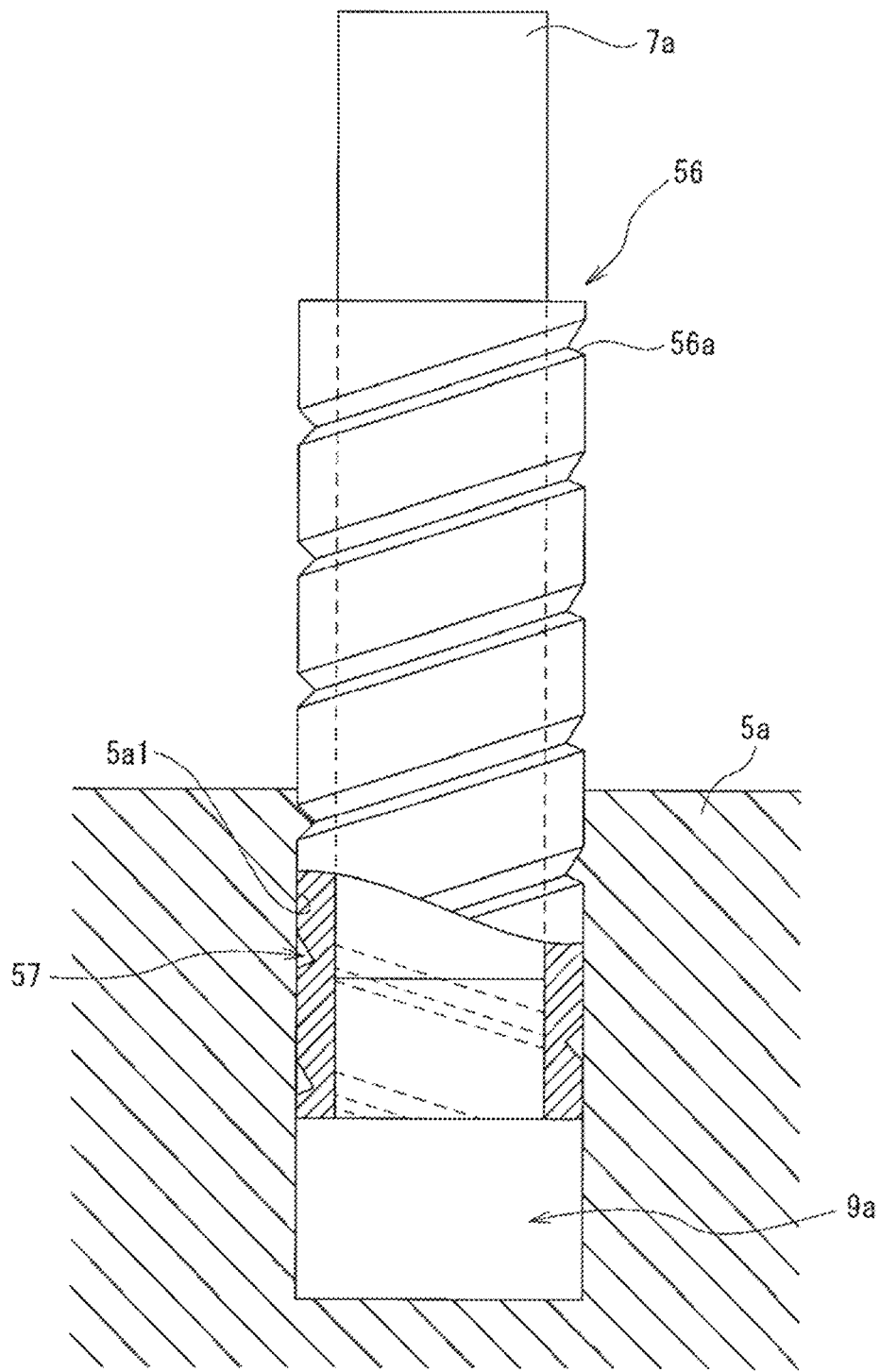
FIG. 10 is a cross-sectional view schematically illustrating the outline of the configuration of a first upper slide support member used in a semiconductor module according to a fifth modification example of the embodiment of the invention, in which the upper portion illustrates a state seen from the front and the lower portion is partially cut.

As illustrated in FIG. 10, in a semiconductor module according to a fifth modification example of the embodiment of the invention, a groove 56a spirally stretching between upper and lower ends is formed in the outside surface of a cylindrical first upper slide support member 56. By this groove 56a, a helical gap is formed between the inner wall surface of the first hole portion 5a1 and the recessed surface of the groove 56a when the first upper slide support member 56 is inserted into the first hole portion 5a1 of the first lower base member 5a. For descriptive purposes, in FIG. 10, a state seen from the front is illustrated in combination when it comes to the upper region of the first upper slide support member 56 excluding the lower portion indicated by notching.

The helical gap functions as an air passage for communication between the gap in the bottom portion of the first hole portion 5a1 and the outside of the first lower base member 5a. During semiconductor module molding, the air in the gap 9a on the lower side of the first upper slide support member 56 is moved to the outside via the helical gap. The molten resin 15 can be poured into the gap 9a as well. The other configurations of the semiconductor module according to the fifth modification example are equivalent to the respective members having the same names in the semiconductor module described with reference to FIGS. 1 to 5, and thus repetitive description will be omitted here.

In the semiconductor module according to the fifth modification example, air removal from the gap 9a is promoted by the helical gap being used, and then the resin 15 can be easily injected. As a result, sealing resin-insulated circuit board integration can be enhanced as in the case of the fourth modification example. The other effects of the semiconductor module according to the fifth modification example are the same as those of the semiconductor module described with reference to FIGS. 1 to 5.

Sixth Modification Example

Figure 11:
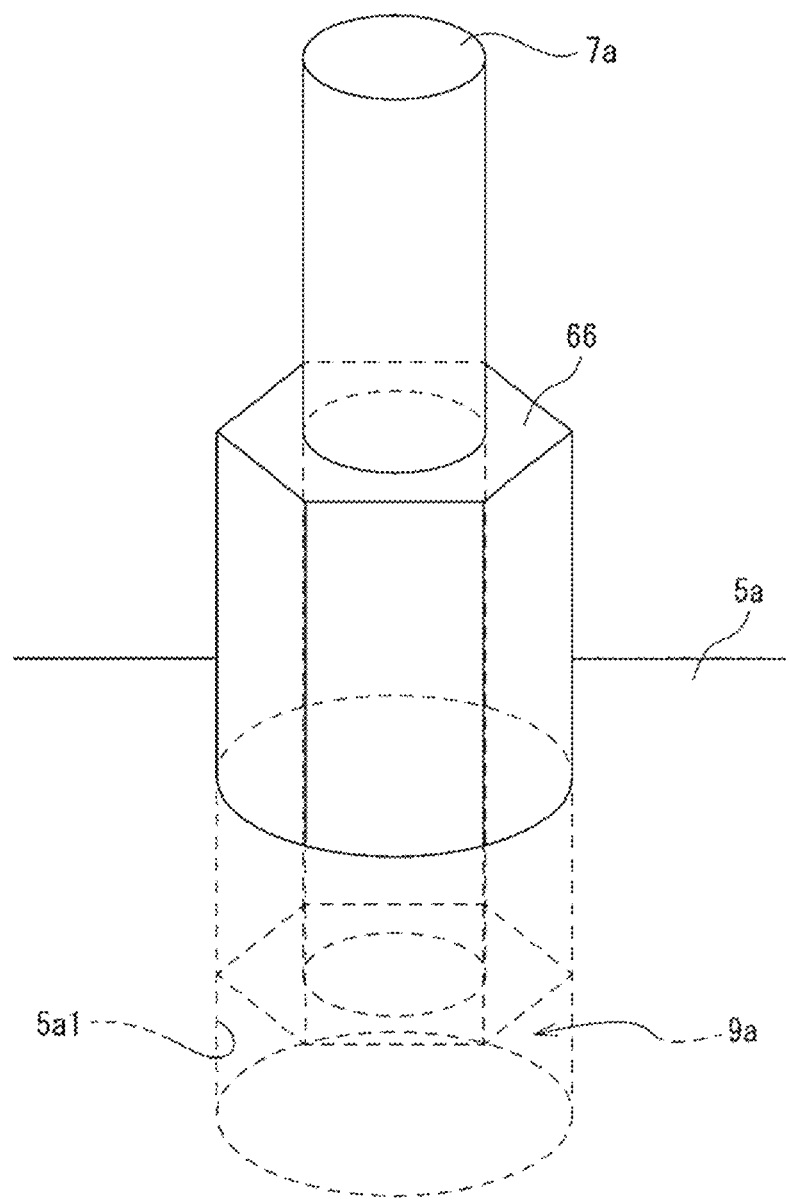
FIG. 11 is a perspective view (bird's eye view) schematically illustrating the outline of the configuration of a first upper slide support member used in a semiconductor module according to a sixth modification example of the embodiment of the invention.

As illustrated in FIG. 11, in a semiconductor module according to a sixth modification example of the embodiment of the invention, a first upper slide support member 66 has a hexagonal prism-shaped outer contour instead of a cylindrical outer contour and forms a tubular shape having a circular pillar-shaped internal space into which the first pin 7a is inserted. In the first upper slide support member 66, six side parts respectively rising from the hexagonal corner portions of the bottom surface and forming boundary lines between the six outside surfaces are provided in contact with the inner wall surface of the first hole portion 5a1 of the first lower base member 5a. The other configurations of the semiconductor module according to the sixth modification example are equivalent to the respective members having the same names in the semiconductor module described with reference to FIGS. 1 to 5, and thus repetitive description will be omitted here.

As in the semiconductor module according to the sixth modification example, in the semiconductor module according to the invention, the outer contour of the first upper slide support member 66 may be a polygonal prism-shaped tube. The polygonal prism is not limited to a hexagonal prism and can be appropriately selected from a triangular prism, a quadrangular prism, an octagonal prism, and the like. In other words, the upper slide support member may be inserted in a state where at least a part of the outside surface is in contact with the inside wall of the hole portion of the lower base member. Further, the shape of the internal space of the first hole portion into which the first upper slide support member 66 is inserted can be appropriately changed in accordance with the outer diameter of the first upper slide support member 66. In FIG. 11, the first hole portion 5a1 has a circular pillar-shaped internal space. However, the invention is not limited thereto, and a hexagonal prism-shaped internal space may be formed in accordance with the hexagonal prism-shaped first upper slide support member 66. Another polygonal prism shape may be selected as well.

In the semiconductor module according to the sixth modification example, a wide variety of variations can be selected as the outer contours of the first upper slide support member 66 and the first hole portion, and thus the degree of freedom in design can be increased. The other effects of the semiconductor module according to the sixth modification example are the same as those of the semiconductor module described with reference to FIGS. 1 to 5.

Seventh Modification Example

Figure 12:
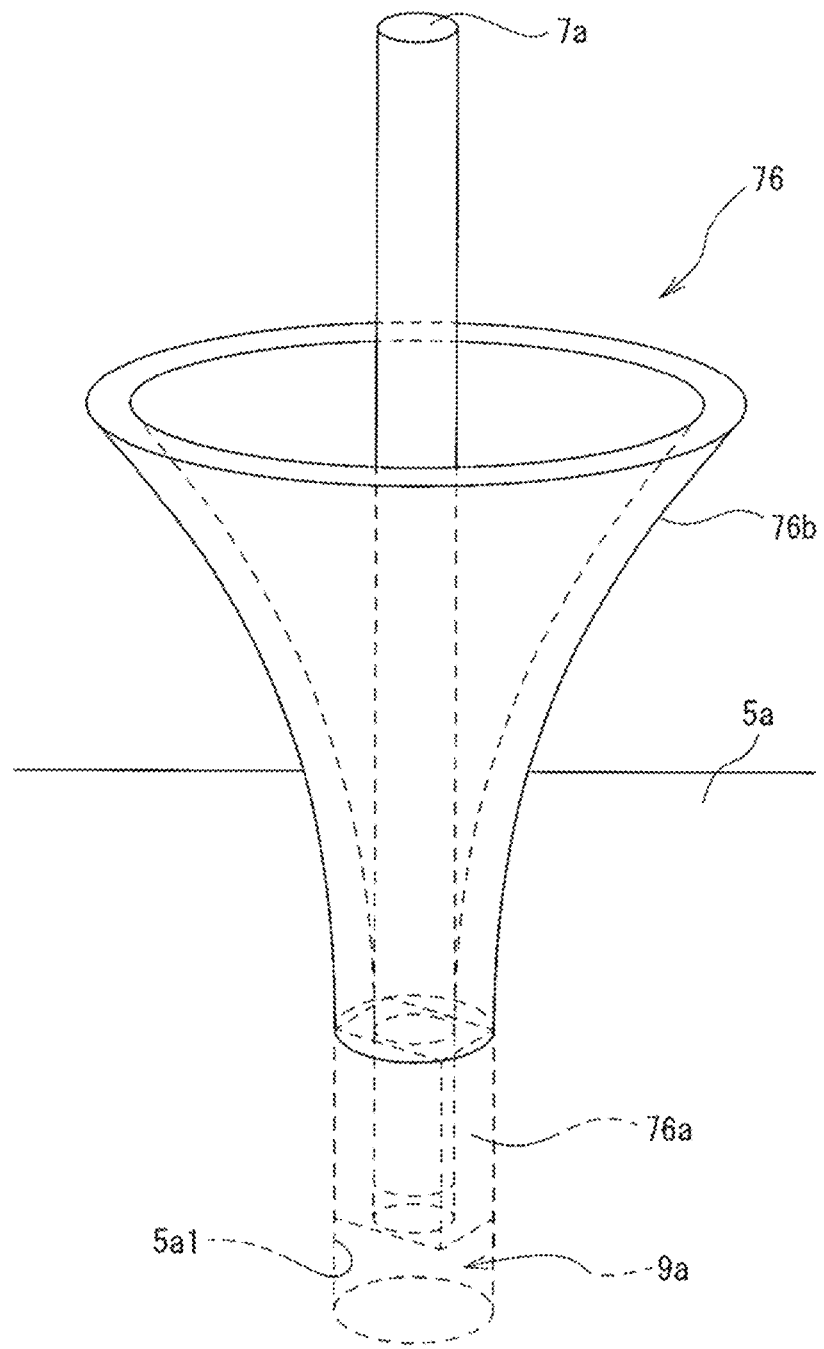
FIG. 12 is a perspective view (bird's eye view) schematically illustrating the outline of the configuration of a first upper slide support member used in a semiconductor module according to a seventh modification example of the embodiment of the invention.

As illustrated in FIG. 12, in a semiconductor module according to a seventh modification example of the embodiment of the invention, a first upper slide support member 76 has a morning glory-shaped outer contour instead of a straight cylindrical outer contour. A lower portion 76a of the first upper slide support member 76 inserted into the first hole portion 5a1 of the first lower base member 5a has a quadrangular prism shape. The shape of an upper portion 76b continuing from the lower portion of the first upper slide support member 76 bulges such that it spreads to the outside in the radial direction of the first pin 7a from the position of the opening portion of the first hole portion 5a1 toward the upper end of the first pin 7a. In other words, inside the first upper slide support member 76, the width between the radially facing inner walls of the upper end exceeds the width between the radially facing inner walls of the lower end.

A method for manufacturing the morning glory-shaped first upper slide support member 76 will be exemplified below. First, a single flat copper plate and the like are prepared along with a punching blade having a quadrangular prism-shaped tip. A planned punching region is vigorously punched with the punching blade without a restraint on the region further apart to the outside by a certain distance from the periphery of the planned punching region of the copper plate. As a result, the first upper slide support member 76 can be manufactured in which the copper plate is deformed into a morning glory shape.

Considered here is a case where the position of the first pin 7a in a planar pattern deviates from the position of the circular pillar-shaped internal space of the lower portion 76a of the first upper slide support member 76 when the first pin 7a is inserted from the upper end side of the morning glory-shaped first upper slide support member 76. Since the upper portion 76b of the first upper slide support member 76 bulges, the lower end of the first pin 7a is in contact with the inner wall surface of the upper portion 76b of the first upper slide support member 76 even if the position of the first pin 7a deviates. When the first pin 7a is pushed downwards, the first pin 7a is guided toward the lower portion 76a of the first upper slide support member 76 by the upper portion 76b having a shape narrowed downwards from above. The other configurations of the semiconductor module according to the seventh modification example are equivalent to the respective members having the same names in the semiconductor module described with reference to FIGS. 1 to 5, and thus repetitive description will be omitted here.

In the semiconductor module according to the seventh modification example, insertion of the first pin 7a is guided by the morning glory-shaped first upper slide support member 76, and thus inconvenience attributable to misalignment and the like in a planar pattern can be suppressed. In addition, the first upper slide support member 76 can be easily manufactured by punching and the like, and thus is highly cost-effective. The other effects of the semiconductor module according to the seventh modification example are the same as those of the semiconductor module described with reference to FIGS. 1 to 5.

Eighth Modification Example

Figure 13:
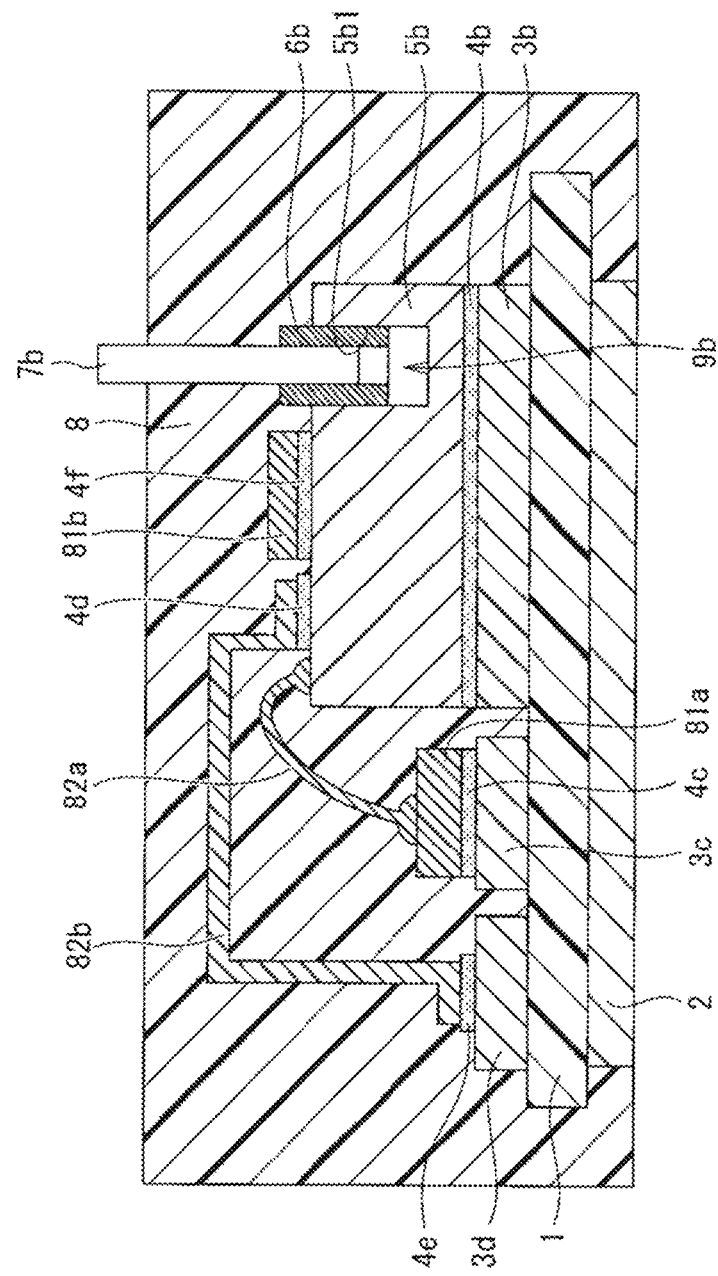
FIG. 13 is a cross-sectional view schematically illustrating the outline of the configuration of a semiconductor module according to an eighth modification example of the embodiment of the invention.

As illustrated in FIG. 13, in a semiconductor module according to an eighth modification example of the embodiment of the invention, a third surface conductive layer 3c and a fourth surface conductive layer 3d are provided on an insulated circuit board (1, 2, 3b, 3c, 3d) along with the second surface conductive layer 3b. A first semiconductor chip 81a is mounted on the third surface conductive layer 3c via a bonding layer 4c. One end of a first wire 82a such as a bonding wire is bonded to the upper surface of the first semiconductor chip 81a, and the other end of the first wire 82a is bonded to the upper surface of the second lower base member 5b.

One end of a second wire 82b is bonded via a bonding layer 4d to the right side of the other end of the first wire 82a bonded on the upper surface of the second lower base member 5b. The other end of the second wire 82b is bonded via a bonding layer 4e on the fourth surface conductive layer 3d. A second semiconductor chip 81b is mounted via a bonding layer 4f on the right side of the bonding layer 4d on the upper surface of the second lower base member 5b.

As in the semiconductor module according to the eighth modification example, in the invention, not only the second pin 7b mounted via the second upper slide support member 6b but also bonding of the second wire 82b, mounting of the first semiconductor chip 81a, and the like are allowed on the single second lower base member 5b. The other configurations of the semiconductor module according to the eighth modification example are equivalent to the respective members having the same names in the semiconductor module described with reference to FIGS. 1 to 5, and thus repetitive description will be omitted here.

In the semiconductor module according to the eighth modification example, various elements other than the second pin 7b can be mounted on the single second lower base member 5b, and thus the degree of freedom in semiconductor module design can be increased. The other effects of the semiconductor module according to the eighth modification example are the same as those of the semiconductor module described with reference to FIGS. 1 to 5.

Ninth Modification Example

As illustrated in FIGS. 14A, 14B, 14C, 14D, 14E, 14F, 14G, 14H, 14I, and 14J, in a semiconductor module according to a ninth modification example of the embodiment of the invention, a first upper slide support member 96 has tubular upper portions 96a1, 96b1, 96c1, 96d1, and 96e1 into which the first pin 7a illustrated in FIG. 1 is inserted and lower portions 96a2, 96b2, 96c2, 96d2, and 96e2 extending from the lower surfaces of the upper portions 96a1, 96b1, 96c1, 96d1, and 96e1 and inserted into the first hole portion 5a1 of the first lower base member 5a illustrated in FIG. 1.

The width between the inner walls of the upper portions 96a1, 96b1, 96c1, 96d1, and 96e1 of the first upper slide support member 96 exceeds the width of the outer contour of the lower portions 96a2, 96b2, 96c2, 96d2, and 96e2. Adoptable as an example of the width of the outer contour of the lower portions 96a2, 96b2, 96c2, 96d2, and 96e2 is the diameter of the circumscribed circle circumscribing each vertex and the like of the outer contour of the lower portions 96a2, 96b2, 96c2, 96d2, and 96e2. The lower portions 96a2, 96b2, 96c2, 96d2, and 96e2 of the first upper slide support member 96 are, for example, inserted and held in the first hole portion 5a1 of the first lower base member 5a illustrated in FIG. 1 and electrically and mechanically connected. Adoptable as the outer contour of the lower portions 96a2, 96b2, 96c2, 96d2, and 96e2 are, for example, a circular pillar shape such as that of a lower portion 96a2, a prism shape with a cross-shaped transverse cross section such as that of a lower portion 96b2, a shape with a part radially protruding outwards from the central axis of the lower portion such as that of a lower portion 96c2, a prism shape with an elliptical cross section such as that of a lower portion 96d2, and a polygonal prism shape such as that of a lower portion 96e2. Although not illustrated, adoptable as an example of the outer contour of the lower end of the lower portions 96a2, 96b2, 96c2, 96d2, and 96e2 is a tapered shape larger in diameter on the upper end side than on the lower end side.

The downward length of the lower portions 96a2, 96b2, 96c2, 96d2, and 96e2 may exceed the width of the lower portions 96a2, 96b2, 96c2, 96d2, and 96e2. The lower portions 96a2, 96b2, 96c2, 96d2, and 96e2 of the first upper slide support member 96 may be molded by pressing and the like being performed on the lower portions 96a2, 96b2, 96c2, 96d2, and 96e2 having the same outer contour as the upper portions 96a1, 96b1, 96c1, 96d1, and 96e1. The other configurations of the semiconductor module according to the ninth modification example are equivalent to the respective members having the same names in the semiconductor module described with reference to FIGS. 1 to 5, and thus repetitive description will be omitted here.

In the semiconductor module according to the ninth modification example, the first pin 7a with a thickness exceeding the diameter of the first hole portion 5a1 can be held with the upper portions 96a1, 96b1, 96c1, 96d1, and 96e1 of the first upper slide support member 96 without a change in the diameter of the first hole portion 5a1 of the first lower base member 5a. As a result, it is possible to increase the current of the first pin 7a of the semiconductor module. Further, the lower portions 96a2, 96b2, 96c2, 96d2, and 96e2 can be easily press-fitted into the first hole portion 5a1 when an uneven shape is given to the lower portions 96a2, 96b2, 96c2, 96d2, and 96e2 of the first upper slide support member 96 or a tapered shape and the like are given to the lower ends of the lower portions 96a2, 96b2, 96c2, 96d2, and 96e2. The other effects of the semiconductor module according to the ninth modification example are the same as those of the semiconductor module described with reference to FIGS. 1 to 5.

Other Embodiments

Although the invention has been described with reference to the above-disclosed embodiment, the description and drawings constituting a part of this disclosure should not be regarded as limiting the invention. From the present disclosure, it should be understood that various alternative embodiments, examples, and operational techniques will be apparent to those skilled in the art.

For example, as illustrated in FIG. 1, in the embodiment of the invention, the first lower base member 5a and the second lower base member 5b have almost the same width w as the first surface conductive layer 3a and the second surface conductive layer 3b forming an underlying circuit pattern. However, the width w of the first lower base member 5a and the second lower base member 5b is not limited to the same width as the first surface conductive layer 3a and the second surface conductive layer 3b. The planar pattern of the first lower base member 5a and the second lower base member 5b may be a shape corresponding to the entire circuit pattern of the first surface conductive layer 3a and the second surface conductive layer 3b or may be a shape corresponding to the shape of a partial region of the circuit pattern.

The first lower base member 5a is bonded on the circuit pattern of the first surface conductive layer 3a of insulated circuit board (1, 2, 3a, 3b), and the second lower base member 5b is bonded on the circuit pattern of the second surface conductive layer 3b. However, the first lower base member 5a and the second lower base member 5b can also be bonded on the insulating plate 1 at a part lacking an underlying circuit pattern and separately and electrically connected by a wire and the like to the circuit pattern formed at a position other than the bonding part.

In the embodiment of the invention, a case has been exemplified where the bonding layers 4a and 4b are formed by soldering. However, the invention is not limited thereto. The bonding layer formation is possible by another method as well, such as a heating bonding method, an ultrasonic bonding method, a laser welding method, and a metal fine particle sintering method. As illustrated in FIG. 1, in the embodiment of the invention, the length of the first upper slide support member 6a and the second upper slide support member 6b exceeds the depth of the first hole portion 5a1 and the second hole portion 5b1. However, the length may be almost equal to or less than the depth as well.

Also, the configurations included in the semiconductor modules according to the embodiment and the modification examples illustrated in FIGS. 1 to 14 may be partially combined. As described above, the invention includes various embodiments and the like not described above, and the technical scope of the invention can be determined only by the specific items in the scope of claims that are reasonable from the above description.

What is claimed is:

1. A semiconductor module, comprising:
an insulated circuit board;
a block-shaped lower base member having a flat lower surface, provided by the flat lower surface being bonded onto the insulated circuit board, and having a bottomed hole portion open in an upper surface in an upper portion of the block-shaped lower base member;
a tubular upper slide support member inserted in the bottomed hole portion in a state where at least a part of an outside surface of the tubular upper slide support member is in contact with an inside wall of the bottomed hole portion;
a pin inserted in contact with an inside of the tubular upper slide support member, a gap being provided between a lower end of the pin and a bottom of the bottomed hole portion; and
a sealing resin sealing the pin in the sealing resin except for an upper portion of the pin on a side opposite to the tubular upper slide support member such that the pin and the tubular upper slide support member are integrated with each other by the sealing resin and have a fixed and unchanging relative position with respect to one another with the gap being provided between the lower end of the pin and the bottom of the bottomed hole portion, and the sealing resin sealing the insulated circuit board, the block-shaped lower base member, and the tubular upper slide support member.

2. The semiconductor module of claim 1, wherein the tubular upper slide support member is cylindrical.

3. The semiconductor module of claim 1, wherein the tubular upper slide support member has a flange wider than the bottomed hole portion between upper and lower ends.

4. The semiconductor module of claim 1, wherein the tubular upper slide support member has an engagement portion engaged with the inside wall of the bottomed hole portion on the outside surface.

5. The semiconductor module of claim 1, wherein the tubular upper slide support member has a slit portion where a slit is provided and the pin is in contact with an inside surface of the slit portion.

6. The semiconductor module of claim 5, wherein the slit continuously stretches across both ends of the tubular upper slide support member.

7. The semiconductor module of claim 1, wherein the tubular upper slide support member has a helical groove in the outside surface.

8. The semiconductor module of claim 1, wherein the tubular upper slide support member is a tube having a polygonal prism-shaped outer contour.

9. The semiconductor module of claim 1, wherein a width between facing inner walls at the upper end on a side opposite to the block-shaped lower base member exceeds a width between facing inner walls at the lower end on the block-shaped lower base member side in the tubular upper slide support member.

10. The semiconductor module of claim 1, wherein the tubular upper slide support member has a tubular upper portion into which the pin is inserted and a lower portion extending from a lower surface of the tubular upper portion and inserted into the bottomed hole portion of the block-shaped lower base member and a width between inner walls of the tubular upper portion exceeds a width of an outer contour of the lower portion.

11. The semiconductor module of claim 10, wherein the outer contour of the lower portion of the tubular upper slide support member has a circular pillar shape, a prism shape with a cross-shaped transverse cross section, a shape with a part radially protruding outwards from a central axis of the lower portion, a prism shape with an elliptical cross section, or a polygonal prism shape.

12. The semiconductor module of claim 10, wherein a downward length of the lower portion exceeds the width of the lower portion in the tubular upper slide support member.

13. The semiconductor module of claim 1, wherein the block-shaped lower base member has a thickness of 300 μm or more and 1 mm or less.

14. The semiconductor module of claim 1, wherein a width of the block-shaped lower base member measured along an outer diameter of the tubular upper slide support member is at least three times the outer diameter of the tubular upper slide support member.

15. A semiconductor module manufacturing method, comprising:
bonding a block-shaped lower base member onto an insulated circuit board via a flat lower surface of the block-shaped lower base member, the flat lower surface of the block-shaped lower base member having a bottomed hole portion open in an upper surface in an upper portion of the block-shaped lower base member;
inserting a tubular upper slide support member into the bottomed hole portion in a state where an outside surface of the tubular upper slide support member is in contact with an inside wall of the bottomed hole portion;
slidably fitting a pin inside the tubular upper slide support member in a state where a gap is formed between a lower end of the pin and a bottom of the bottomed hole portion;
sliding the pin inside the tubular upper slide support member and adjusting an insertion depth of the pin to a preset insertion depth by applying a force to an upper end of the pin on a side opposite to the tubular upper slide support member to move the pin toward the tubular upper slide support member side such that the lower end of the pin moves toward the bottom of the bottomed hole portion to decrease a size of the gap formed between the lower end of the pin and the bottom of the bottomed hole portion, a gap remaining between the lower end of the pin and the bottom of the bottomed hole portion after the pin is inserted to the preset insertion depth; and
sealing the pin in a sealing resin except for an upper portion of the pin on a side opposite to the tubular upper slide support member such that the pin and the tubular upper slide support member are integrated with each other by the sealing resin and have a fixed and unchanging relative position with respect to one another with the gap remaining between the lower end of the pin and the bottom of the bottomed hole portion, and sealing the insulated circuit board, the block-shaped lower base member, and the tubular upper slide support member in the sealing resin.

16. The semiconductor module manufacturing method of claim 15, wherein
sliding the pin inside the tubular upper slide support member and adjusting the insertion depth of the pin to the preset insertion depth comprises:
moving at least one of a first mold and a second mold toward each other so that the first mold abuts against the upper end of the pin on the side opposite to the tubular upper slide support member and the second mold abuts against a lower surface of the insulated circuit board, and
sealing the pin in the sealing resin except for the upper portion of the pin on the side opposite to the tubular upper slide support member, and sealing the insulated circuit board, the block-shaped lower base member, and the tubular upper slide support member in the sealing resin comprises:
injecting the sealing resin into an internal space formed by the first and second molds.

17. A semiconductor module, comprising:
an insulated circuit board;
a first block-shaped lower base member having a first flat lower surface, provided by the first flat lower surface being bonded onto the insulated circuit board, and having a first bottomed hole portion open in an upper surface in an upper portion of the first block-shaped lower base member;
a first tubular upper slide support member inserted in the first bottomed hole portion in a state where at least a part of an outside surface of the first tubular upper slide support member is in contact with an inside wall of the first bottomed hole portion;
a first pin inserted in contact with an inside of the first tubular upper slide support member, a first gap being provided between a lower end of the first pin, and a bottom of the first bottomed hole portion;
a second block-shaped lower base member having a second flat lower surface, provided by the second flat lower surface being bonded onto the insulated circuit board, and having a second bottomed hole portion open in an upper surface in an upper portion of the second block-shaped lower base member;
a second tubular upper slide support member inserted in the second bottomed hole portion of the second block-shaped lower base member in a state where at least a part of an outside surface of the second tubular upper slide support member is in contact with an inside wall of the second bottomed hole portion;
a second pin inserted in contact with an inside of the second tubular upper slide support member, a second gap being provided between a lower end of the second pin and a bottom of the second bottomed hole portion, a length of the second pin being less than a length of the first pin; and
a sealing resin which seals the first pin in the sealing resin except for an upper portion of the first pin on a side opposite to the first tubular upper slide support member, seals the second pin in the sealing resin except for an upper portion of the second pin on a side opposite to the second tubular upper slide support member, and seals the insulated circuit board, the first block-shaped lower base member, and the first tubular upper slide support member.

18. The semiconductor module of claim 17, wherein
a size of the second gap provided between the lower end of the second pin and the bottom of the second bottomed hole portion is greater than a size of the first gap provided between the lower end of the first pin and the bottom of the first bottomed hole portion, and
a protruding height of the second pin from an upper surface of the sealing resin is equal to a protruding height of the first pin from the upper surface of the sealing resin.

19. A semiconductor module, comprising:
an insulated circuit board;
a block-shaped lower base member having a flat lower surface, provided by the flat lower surface being bonded onto the insulated circuit board, and having a bottomed hole portion open in an upper surface in an upper portion of the block-shaped lower base member;
a tubular upper slide support member inserted in the bottomed hole portion in a state where at least a part of an outside surface of the tubular upper slide support member is in contact with an inside wall of the bottomed hole portion;
a pin inserted in contact with an inside of the tubular upper slide support member; and
a sealing resin sealing the pin in the sealing resin except for an upper portion of the pin on a side opposite to the tubular upper slide support member and sealing the insulated circuit board, the block-shaped lower base member, and the tubular upper slide support member,
wherein a width of the block-shaped lower base member measured along an outer diameter of the tubular upper slide support member is at least three times the outer diameter of the tubular upper slide support member.

20. The semiconductor module of claim 1, wherein
the lower end of the pin is positioned above a lower end of the tubular upper slide support member with the gap further being provided between the bottom of the bottomed hole portion and the lower end of the tubular upper slide support member.

* * * * *